United States Patent
Okada

(10) Patent No.: US 7,886,252 B2
(45) Date of Patent: Feb. 8, 2011

(54) SAME SUBGRAPH DETECTOR FOR DATA FLOW GRAPH, HIGH-ORDER COMBINER, SAME SUBGRAPH DETECTING METHOD FOR DATA FLOW GRAPH, SAME SUBGRAPH DETECTION CONTROL PROGRAM FOR DATA FLOW GRAPH, AND READABLE RECORDING MEDIUM

(75) Inventor: Kazuhisa Okada, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 774 days.

(21) Appl. No.: 11/666,859

(22) PCT Filed: Nov. 7, 2005

(86) PCT No.: PCT/JP2005/020387

§ 371 (c)(1),
(2), (4) Date: Oct. 22, 2007

(87) PCT Pub. No.: WO2006/051760

PCT Pub. Date: May 18, 2006

(65) Prior Publication Data

US 2008/0040699 A1 Feb. 14, 2008

(30) Foreign Application Priority Data

Nov. 10, 2004 (JP) .............................. 2004-327110

(51) Int. Cl.
*G06F 17/50* (2006.01)
(52) U.S. Cl. .................................. 716/18; 716/2; 716/3
(58) Field of Classification Search ...................... 716/2, 716/3, 18
See application file for complete search history.

(56) References Cited

U.S. PATENT DOCUMENTS 5,650,948 A * 7/1997 Gafter ........................... 716/3

(Continued)

FOREIGN PATENT DOCUMENTS

JP 11-96203 4/1999
JP 2001-229169 8/2001

(Continued)

OTHER PUBLICATIONS

Dirk Herrmann et al. "Improved Interconnect Sharing by Identity Operation Insertion." Computer-Aided Design, IEEE, pp. 489-492, ISBN 0-7803-5832-5, 1999.

*Primary Examiner*—Sun J Lin
(74) *Attorney, Agent, or Firm*—Harness, Dickey & Pierce, P.L.C.

(57) ABSTRACT

A same sub-graph detection apparatus for data flow graph is disclosed. An embodiment of the present invention detects a sub-graph at a high speed, in which an area-size reduction effect is large. The same sub-graph detection apparatus for data flow graph according to an embodiment of the present invention includes for a digital circuit behaviour, a conditional branching selection section for selecting one conditional branching from one or a plurality of conditional branchings in a data flow graph; a node set selection section for selecting a node set included in the selected conditional branching; a node grouping section for dividing the selected node set into several groups; and using each of the divided groups as a sub-graph, a sub-graph comparison section for detecting the same sub-graphs by comparing a plurality of sub-graphs obtained as a result of each processing performed on the one or the plurality of conditional branchings by the conditional branching selection section, the node set selection section and the node grouping section. The same sub-graph detection apparatus for data flow graph according to an embodiment of the present invention divides nodes included in each conditional branching in the data flow graph into groups in accordance with a prescribed rule, uses each of the groups as a sub-graph and detects the same sub-graphs by comparing the subgraphs.

35 Claims, 18 Drawing Sheets

U.S. PATENT DOCUMENTS

| | | | |
|---|---|---|---|
| 5,666,296 A * | 9/1997 | Gafter | 716/3 |
| 6,360,355 B1 * | 3/2002 | Nishida et al. | 716/18 |
| 6,604,232 B2 * | 8/2003 | Okada et al. | 716/18 |
| 7,472,359 B2 * | 12/2008 | Ciesielski et al. | 716/2 |
| 7,565,631 B1 * | 7/2009 | Banerjee et al. | 716/3 |

FOREIGN PATENT DOCUMENTS

JP    2001-229217    8/2001

\* cited by examiner

Fig.2

```
if (i < 5) {
    x += 10;
} else {
    x -= 5;
} if (j < 5) {
    y += 10;
} else {
    y -= 5;
}
``` x = a * b + b * c;

Fig.15

```
struct Node
{
    int node_id;
    int in_edge[2];
    int out_edge[1];
    int op_type;
} struct Edge
{
    int from_node;
    int to_node;
}
```

SAME SUBGRAPH DETECTOR FOR DATA
FLOW GRAPH, HIGH-ORDER COMBINER,
SAME SUBGRAPH DETECTING METHOD
FOR DATA FLOW GRAPH, SAME SUBGRAPH
DETECTION CONTROL PROGRAM FOR
DATA FLOW GRAPH, AND READABLE
RECORDING MEDIUM

TECHNICAL FIELD

The present invention relates to: a same sub-graph detection apparatus for detecting the same sub-graph in a data flow graph in order to reduce a circuit-occupied area by sharing a circuit when performing a behavioral synthesis (high-level synthesis), which is used for an automatic design of a large-scale logic circuit (e.g., system LSI and the like) and which performs a computer-automated synthesis of a logic circuit from a behavioral description; a high-level synthesis apparatus using the same sub-graph detection apparatus for data flow graph; a same sub-graph detection method for data flow graph using the same sub-graph detection apparatus; a same sub-graph detection control program for data flow graph for causing a computer to execute each processing procedure of the same sub-graph detection method for data flow graph; and computer-readable recording medium having the control program recorded thereon.

BACKGROUND ART

Conventionally, in designing a large-scale circuit (e.g., system LSI), a behavioral synthesis which generates a description of RTL (Register Transfer Level) is performed from a behavioral description of a circuit. This behavioral synthesis is also called high-level synthesis.

In this behavioral synthesis, a circuit diagram for hardware is automatically synthesized from a behavioral description, which only describes an algorithm for processing but does not include information regarding the structure of the hardware.

For example, according to a behavioral synthesis system described in Reference 1, it is possible to synthesize a circuit diagram for hardware using the language, in which C language is extended for hardware design, as a behavioral description language.

Hereinafter, a procedure of this behavioral synthesis will be briefly described.

In this behavioral synthesis, first, the flow of data in the algorithm described with the behavioral description language is analyzed, and a model called data flow graph is created.

In a digital circuit, by performing various computations on a plurality of data, the processing intended by the digital circuit is performed. The graph which represents the computations and the flow of data in this case is the data flow graph.

This data flow graph is structured with a plurality of nodes and branches which connect the nodes. A node represents one computation performed in the digital circuit. A branch represents the flow of data from one computation to another computation. By appropriately connecting branches with nodes representing computations, it is possible to represent the behavior of the digital circuit as the data flow graph.

Each node in the data flow graph is connected by an input branch and an output branch. The input branch represents data to be given for computation. The output branch represents data obtained as a result of the computation. In addition, each node includes information regarding the type of a computation and the like.

For example, the behavioral description described with C language shown in FIG. 13 can be represented by the data flow graph shown in FIG. 14.

FIG. 14 includes two nodes 101 and 102 representing multiplication and one node 103 representing addition. FIG. 14 shows adding the result obtained by multiplying inputs a and b and the result obtained by multiplying inputs b and c and then outputting the result of adding to x.

On a computer, the data flow graph in FIG. 14 is represented by, for example, a data structure shown in FIG. 15.

In FIG. 15, the node is represented by Node structure (struct Node) and includes a node number node_id specific to each node. in_edge and out_edge stores, the branch number of input branches to each node and the branch number of output branches to each node, respectively. In the example in FIG. 15, the node represents a computation with two inputs and one output; hence, in_edge has two elements and out_edge has one element. In op_type, numbers representing the types of computations such as addition, subtraction, multiplication and the like are stored.

The branch is represented by Edge structure (struct Edge), and includes a branch number edge_id specific to each branch. from_node and to_node of a branch stores the node numbers of the nodes connected by that branch.

With these data structures, the connection between each branch in the data flow graph is stored in a memory (database) of a computer.

In the data flow graph, when nodes are connected to each other or when it is intended to find another node which is connected to an input/output of one node, branch numbers and node numbers are registered to the elements in the database described above and the elements in the database are made reference to. Hereinafter, in order to make a description understood easily, when nodes are connected by branches or when it is intended to find nodes which are connected to a node which proceeds and follows, the description will be made with reference to a diagram visually showing the data flow graph, as shown in FIG. 14.

Next, a scheduling process and an allocation process are performed on the data flow graph. The scheduling is a process for determining when each node in the data flow graph is executed. The allocation is called binding and includes a process for determining a register for storing data represented by a branch in the data flow graph and a process for determining which computing unit is used in order to perform a computation represented by a node in the data flow graph. Depending on a behavioral synthesis method, the allocation is performed prior to the scheduling.

Next, based on the result of the scheduling and the result of the allocation, a data path and a controller are generated, and hardware is obtained. An example of the processing in order to obtain a circuit from the data flow graph is, for example, disclosed in Reference 2.

In the behavioral synthesis, it is important to use one computing unit a plurality of times in order to perform a plurality of computation processings. Hence, the number of computing units in a chip is reduced, thus resulting in the reduction of the area of the chip. Thus, it is possible to reduce a cost for manufacturing a chip.

Accordingly, in the behavioral synthesis, it is important to contrive such that as many computations as possible share a computing unit.

When the same type of the computation is executed at different steps, then it is possible to process the computations with one computing unit. Thus, in the scheduling process, it is necessary to contrive so as to obtain a scheduling in which the same type of computation is performed at different steps. Such a scheduling method is, for example, disclosed in Reference 3.

In the allocation process, when there is a plurality of methods of sharing a computing unit, it is necessary to select a sharing method such that the area of a circuit becomes as small as possible. Such an allocation method is, for example, disclosed in Reference 4.

As described above, the method of sharing the computing unit per the same type of computation is effective in reducing the area of the circuit. However, when a combination of a series of computations appears a plurality of time during the entire process, in order to further reduce the size of the area, it is effective to create a circuit for a sub-graph (partial graph) representing the combination of the series of computations in the data flow graph and to share the entire circuit.

The reason for this is because a selector is only required for an input of the entire shared circuit and no selector is required for individual computations in the circuit.

For example, in an example in Portion (a) of FIG. 16, sub-graphs 111 and 112 including two additions and one multiplication are the same. Thus, when the scheduling is performed such that these are executed at different clock cycles, then it is possible to share one circuit 113, as shown in Figure Portion (b) of FIG. 16. This circuit 113 is a circuit for executing the sub-graphs 111 and 112 by repeating the processing.

In the first clock step, the result obtained by an adder 114 is selected by a selector 115 and then input to the circuit 113. The result computed by the circuit 113 is stored in a register 116.

In the second clock step, an output of the register 116 is selected by the selector 115 and then input to the circuit 113. The result computed by the circuit 113 is output to the outside.

In Portion (b) of FIG. 16, control signals for the selector 115 and the register 116 are omitted.

When the circuit is not shared, it is necessary to have another circuit equivalent to the circuit 113. Thus, when the area of the circuit 113 is larger than that of the selector 115 and the register 116 which are required when the circuit is shared, it is possible to reduce the size of the area by sharing the circuit.

As described above, in order to share the circuit, it is necessary to search a plurality of same sub-graphs from the data flow graph.

However, in a problem of searching the same partial graphs from the data flow graph, it is commonly known that the number of search processings increases exponentially with respect to the increase of the number of nodes in the data flow graph. Thus, when the data flow becomes large, the time required for processing becomes extremely long, which is not practical. As such, it is necessary to contrive in order to easily search the same sub-graphs from the data flow graph.

For example, Reference 5 discloses a method of searching similar sub-graphs from a data flow graph. Here, the "similar" sub-graphs indicate sub-graphs which become the same sub-graphs by inserting computations resulting in a no-value change (e.g., addition of "0" and multiplication of "1"). In other words, the graph searching method described in Reference 5 determines whether graphs are similar to each other or not when the same sub-graphs are searched, instead of determining whether the graphs are the same to each other or not, which is essentially the same as the search for the same sub-graphs.

In this similar sub-graph searching method, in order to find similar sub-graphs at a high speed, a contrivance described below is carried out. In other words, as shown in Portion (a) of FIG. 17 and Portion (b) of FIG. 17, the similar sub-graph searching method is limited to n number of stages with no branching in a sub-graph.

When it is assumed that the number of inputs for each computation in this data flow graph is "2", then, as shown in FIG. 18, the three stages of the sub-graphs having node F as an output are four combinations of A-D-F, B-D-F, B-E-F and C-E-F. Generally, there is a computation which has only one input, and a computation having three or more inputs is rare. Therefore, sub-graphs are often less than four combinations. Thus, when it is assumed that the total number of nodes in the data flow graph is N, the number of sub-graphs in the data flow graph is at most 4N, which is possible to compute by a computer. Hence, it is possible to compare these sub-graphs and find similar sub-graphs.

Generally, the number of sub-graphs for n number of stages is $N \times 2^{(n-1)}$. In a large-scale circuit, the number of nodes N in a data flow graph is about 10,000. When n becomes smaller, the number of nodes N can be handled by a computer.

[Reference 1] Japanese Laid-Open Publication No. 2001-229217

[Reference 2] Japanese Laid-Open Publication No. 2000-348069

[Reference 3] Japanese Laid-Open Publication No. 2003-76728

[Reference 4] "AC-based Synthesis System, Bach, and its Application" Proceedings of the ASP-DAC 2001, 2001 (IEEE Catalog Number: 01EX455, ISBN: 0-7803-6633-6)

[Reference 5] "Improved Interconnect Sharing by Identity Operation Insertion" Proceedings of the ICCAD 1999, 1999 IEEE (ISBN: 0-7803-5832)

DISCLOSURE OF THE INVENTION

However, in the conventional method disclosed in Reference 5, the shape of the sub-graph for search is limited to n stages of graphs with no branching. Therefore, in some cases, a multiplicity of selectors is required in a circuit for performing the sub-graph.

For example, when a sub-graph is a graph of four stages as shown in Portion (a) of FIG. 19, in order to use the sub-graph at two locations, a circuit as shown in Portion (b) of FIG. 19 is required, and selectors up to five are required in some cases. As such, this conventional method cannot search a sub-graph in which when a circuit is shared, the number of selectors required is small, and the effect of reducing the size of the area due to the sharing is large.

For example, in a sub-graph having branchings as shown in Portion (a) of FIG. 20, the number of selectors required when this sub-graph is shared at two locations is one as shown in Portion (b) of FIG. 20, despite many computations being included in the sub-graph.

As described above, although there are many computations involved, if a sub-graph which has fewer number of inputs and outputs is found, the effect of the area-size reduction is large since the number of selectors for sharing a circuit for executing the sub-graph is small.

However, such a sub-graph does not satisfy the condition for the sub-graph searched by the conventional method described above. Thus, it cannot be searched by the conventional method.

In order to search a computation having a branching, as shown in Portion (a) of FIG. 20, with the conventional method described above, when being deviated from the condition for the sub-graph prescribed in the conventional method described above, it takes an enormous time for the processing, and thus this is not practical.

In other words, as shown in each of the examples in Portion (a) of FIG. 21 to Portion (d) of FIG. 21, the number of patterns of the shapes of the sub-graphs is countless and the number of sub-graphs included in the data flow graph is extremely large. Thus, the same sub-graphs cannot be found in a practical processing time.

The present invention is intended to solve the problems described above, and the objective of the present invention is to provide: a same sub-graph detection apparatus for data flow graph for detecting, in the same sub-graph in a data flow graph, a sub-graph at a high speed, in which an area-size reduction effect is large owing to the execution of the behaviors of the sub-graphs by a shared circuit; a high-level synthesis using the same sub-graph detection apparatus for data flow graph; a same sub-graph detection method for data flow graph using the same sub-graph detection apparatus; a same sub-graph detection control program for data flow graph for causing a computer to execute each processing procedure of the same sub-graph detection method for data flow graph; and computer-readable recording medium having the control program recorded thereon.

A same sub-graph detection apparatus for data flow graph according to the present invention includes: for a digital circuit behavior, conditional branching selection section for selecting one conditional branching from one or a plurality of conditional branchings in a data flow graph represented by a plurality of nodes indicating computations and branches indicating flows of data input/output to the nodes; node set selection section for selecting a node set included in the selected conditional branching; node grouping section for dividing the selected node set into several groups; and using each of the divided groups as a sub-graph, sub-graph comparison section for detecting same sub-graphs by comparing a plurality of sub-graphs obtained as a result of each processing performed on the one or the plurality of conditional branchings by the conditional branching selection section, the node set selection section and the node grouping section, thereby the objective described above being achieved.

Preferably, a same sub-graph detection apparatus for data flow graph according to the present invention further includes graph compacting section for compacting at least some of input units and output units of the groups, which are divided by the node grouping section in the same sub-graph detection apparatus for data flow graph according to the present invention, with respect to a circuit-occupied area and outputting a compacted sub-graph.

Still preferably, the conditional branching selection section in the same sub-graph detection apparatus for data flow graph according to the present invention selects the conditional branchings in a predetermined or arbitrary order.

Still preferably, the node set selection section in the same sub-graph detection apparatus for data flow graph according to the present invention selects, as the node set, a node included in a true block executed when a condition of the conditional branching is "true" and a node included in a false block executed when the condition of the conditional branching is "false".

Still preferably, the node set selection section in the same sub-graph detection apparatus for data flow graph according to the present invention adds, to the node set, a selector node for selecting an output from the true block executed when the condition of the conditional branching is "true" and an output from the false block executed when the condition of the conditional branching is "false".

Still preferably, for each output node that generates an output of a true block or a false block that is executed when a condition of the conditional branching is "true" or "false", the node grouping section in the same sub-graph detection apparatus for data flow graph according to the present invention obtains a combination of the nodes for each node included in the true block or the false block, wherein the outputs of the nodes to be obtained have an affect on the output nodes; and divides combinations of the nodes for the output nodes into node groups, which are the same among the combinations of the nodes for the output nodes, and node groups for each output node other than said computation nodes.

Still preferably, using the selector node as an output node that generates an output of a true block or a false block that is executed when a condition of the conditional branching is "true" or "false", the node grouping section in the same sub-graph detection apparatus for data flow graph according to the present invention obtains a combination of the nodes for each node included in the true block or the false block, wherein the outputs of the nodes to be obtained have an affect on the output nodes; and divides combinations of the nodes for the output nodes into node groups, which are the same among the combinations of the nodes for the output nodes, and node groups for each output node other than said computation nodes.

Still preferably, the graph compacting section in the same sub-graph detection apparatus for data flow graph according to the present invention, targeting on each node located at the input unit of the node group divided by the node grouping section, compares a sum of an area occupied by a circuit for executing the sub-graph and an area occupied by a selector required when the circuit is shared at a plurality of locations to a sum of an area occupied by a circuit for executing a sub-graph with a targeted node removed from the sub-graph which includes the targeted computation node, an area occupied by a selector required when the circuit is shared at a plurality of locations and an area occupied by a computing unit required in order to execute the removed targeted node, and when the sum of the latter is smaller than the sum of the former, the targeted node is removed from the sub-graph and the input unit is compacted.

Still preferably, when each output node of the group divided by the node grouping section is the selector node and a plurality of nodes connected to an input side of the selector node are all of a same computation type, the graph compacting section in the same sub-graph detection apparatus for data flow graph according to the present invention compares an area occupied by a circuit for executing a sub-graph having the nodes of the same computation type connected to each input side of the selector node to an area occupied by a circuit for executing another sub-graph having an output of the selector node connected to the input side of one node of the same computation type, and when the area occupied by the former is larger than the area occupied by the latter, the graphs compacting section changes the sub-graph such that the output of the selector node is connected to the input side of the one node of the same computation type.

Still preferably, the sub-graph comparison section in the same sub-graph detection apparatus for data flow graph according to the present invention detects the same sub-graphs by creating character strings corresponding to shapes of the respective sub-graphs with a one to one relationship, comparing the character strings and detecting same character strings.

Still preferably, the sub-graph comparison section in the same sub-graph detection apparatus for data flow graph according to the present invention detects the same subgraphs by comparing hash values obtained by inputting the character strings into a hash function, detecting same hash values and detecting the same character strings.

A high-level synthesis apparatus according to the present invention for automatically designing a circuit diagram by performing a scheduling process and an allocation process on a data flow graph generated by using the same sub-graph detection apparatus for data flow graph described above and generating a data path and a controller based on a scheduling result and an allocation result, thereby the objective described above being achieved.

A same sub-graph detection method for data flow graph according to the present invention includes: for a digital circuit behavior, conditional branching selection step of selecting one conditional branching from one or a plurality of conditional branchings in a data flow graph represented by a plurality of nodes indicating computations and branches indicating flows of data input/output to the nodes; node set selection step of selecting a node set included in the selected conditional branching; node grouping step of dividing the selected node set into several groups; and using each of the divided groups as a sub-graph, sub-graph comparison step of detecting same sub-graphs by comparing a plurality of sub-graphs obtained by performing the conditional branching selection step, the node set selection step and the node grouping step on the one or the plurality of conditional branchings, thereby the objective described above being achieved.

Preferably, a same sub-graph detection method for data flow graph according to the present invention further includes graph compacting step of compacting at least some of input units and output units of the groups, which are divided by the node grouping step in the same sub-graph detection method for data flow graph according to the present invention, with respect to a circuit-occupied area and outputting a compacted sub-graph.

Still preferably, the conditional branching selection step in the same sub-graph detection method for data flow graph according to the present invention selects the conditional branchings in a predetermined or arbitrary order.

Still preferably, the node set selection step in the same sub-graph detection method for data flow graph according to the present invention selects, as the node set, a node included in a true block executed when a condition of the conditional branching is "true" and a node included in a false block executed when the condition of the conditional branching is "false".

Still preferably, the node set selection step in the same sub-graph detection method for data flow graph according to the present invention adds, to the node set, a selector node for selecting an output from the true block executed when the condition of the conditional branching is "true" and an output from the false block executed when the condition of the conditional branching is "false".

Still preferably, for each output node that generates an output of a true block or a false block that is executed when a condition of the conditional branching is "true" or "false", the node grouping step in the same sub-graph detection method for data flow graph according to the present invention obtains a combination of the nodes for each node included in the true block or the false block, wherein the outputs of the nodes to be obtained have an affect on the output nodes; and divides combinations of the nodes for the output nodes into node groups, which are the same among the combinations of the nodes for the output nodes, and node groups for each output node other than said computation nodes.

Still preferably, using the selector node as an output node that generates an output of a true block or a false block that is executed when a condition of the conditional branching is "true" or "false", the node grouping step in the same sub-graph detection method for data flow graph according to the present invention obtains a combination of the nodes for each node included in the true block or the false block, wherein the outputs of the nodes to be obtained have an affect on the output nodes; and divides combinations of the nodes for the output nodes into node groups, which are the same among the combinations of the nodes for the output nodes, and node groups for each output node other than said computation nodes.

Still preferably, the graph compacting step in the same sub-graph detection method for data flow graph according to the present invention, targeting on each node located at the input unit of the node group divided by the node grouping step, compares a sum of an area occupied by a circuit for executing the sub-graph and an area occupied by a selector required when the circuit is shared at a plurality of locations to a sum of an area occupied by a circuit for executing a sub-graph with a targeted node removed from the sub-graph which includes the targeted computation node, an area occupied by a selector required when the circuit is shared at a plurality of locations and an area occupied by a computing unit required in order to execute the removed targeted node, and when the sum of the latter is smaller than the sum of the former, the targeted node is removed from the sub-graph and the input unit is compacted.

Still preferably, when the output node of the group divided by the node grouping step is the selector node and a plurality of nodes connected to an input side of the selector node are all of a same computation type, the graph compacting step in the same sub-graph detection method for data flow graph according to the present invention compares an area occupied by a circuit for executing a sub-graph having the nodes of the same computation type connected to the input side of the selector node to an area occupied by a circuit for executing another sub-graph having an output of the selector node connected to the input side of one node of the same computation type, and when the area occupied by the former is larger than the area occupied by the latter, the graphs compacting step change the sub-graph such that the output of the selector node is connected to the input side of the one node of the same computation type.

Still preferably, the sub-graph comparison step in the same sub-graph detection method for data flow graph according to the present invention detects the same sub-graphs by creating character strings corresponding to shapes of the respective sub-graphs with a one to one relationship, comparing the character strings and detecting same character strings.

Still preferably, the sub-graph comparison step in the same sub-graph detection method for data flow graph according to the present invention detects the same sub-graphs by comparing hash values obtained by inputting the character strings into a hash function, detecting same hash values and detecting the same character strings.

A same sub-graph detection control program for data flow graph according to the present invention having each processing step described thereon for causing a computer to execute the same sub-graph detection method for data flow graph described above, thereby the objective described above being achieved.

A computer-readable recording medium according to the present invention having the same sub-graph detection control program for data flow graph described above recorded thereon, thereby the objective described above being achieved.

With the structures described above, hereinafter, the function of the present invention will be described.

The present invention targets on a conditional branching in order to effectively search the same sub-graph. There are often the cases in which similar processings are described in conditional branchings. Thus, by searching the vicinity of the conditional branching, it is possible to effectively detect the same sub-graphs.

First, one conditional branching is selected from a data flow graph, a node set included in the selected conditional branching is selected, and the selected node set is divided into several groups. These processings are performed on each conditional branching. Using each of the divided graphs as a sub-graph, a plurality of sub-graphs is compared so as to detect the same sub-graphs.

For example, in selecting the node set, nodes included in a true block and a false block are selected. A selector node for selecting outputs of the true block and the false block can be added to the node set.

When the node grouping is conducted, a combination of computation nodes is obtained for the computation nodes included in the true block or the false block, wherein the outputs of the computation nodes have affect on an output node. The computation nodes making up the same type of combinations of computation nodes for the output nodes are considered as the same type of node group. As described above, by grouping nodes in accordance with a prescribed rule, when the same data flow graph exists at a different location, then exactly the same grouping is conducted. When a similar flow data graph exists at a different location, there is an increasing possibility that a common portion can be retrieved as a group.

In addition, by making an input unit and an output unit of the sub-graph compact, it is possible to reduce the number of selectors required when a circuit is shared.

For example, targeting on each computation node located at an input unit of the sub-graph, the sum of the area occupied by a circuit for executing the sub-graph and the area occupied by a selector required when the circuit is shared at a plurality of locations, and the sum of the area occupied by a circuit for executing a sub-graph with a targeted computation node removed from the sub-graph which includes the targeted computation node, the area occupied by a selector required when the circuit is shared at a plurality of locations and the area occupied by a computing unit required in order to execute the removed targeted computation node are compared. When the latter is smaller, it is possible to control such that the targeted computing node is removed from the sub-graph.

In addition, when an output node of a sub-graph is a selector and a plurality of nodes connected to an input of the selector are all of the same computation type A, the area occupied by a circuit for executing a sub-graph having the computation of type A connected to an input of each of the selectors and the area occupied by a circuit for executing another sub-graph having an output of the selector connected to an input of one computation of type A are compared. When the former is larger, it is possible to change the sub-graph such that the output of the selector is connected to the input of the one computation of type A.

When sub-graphs are compared, it is possible by comparing character strings or hash values to effectively detect the same sub-graphs.

As described above, according to present invention, it is possible to detect the same sub-graphs in the data flow graph at a high speed, and by processing the plurality of same sub-graphs using a shared circuit, it is possible to prevent the increase of the area of hardware and the increase of a cost.

In addition, it is possible to obtain sub-graphs to be detected, in which the number of selectors required when sharing a circuit for processing the sub-graphs is small and an area-size reduction effect due to the sharing is large.

BRIEF DESCRIPTION OF THE DRAWINGS

Portion (a) of FIG. 1 is a diagram showing an example of a behavioral description including a conditional branching which is targeted in the present invention; and Portion (b) of FIG. 1 is a diagram showing an example of a data flow of Portion (a) of FIG. 1.

FIG. 2 is a diagram showing another example of the behavioral description including the conditional branching which is targeted in the present invention.

Figure 7:
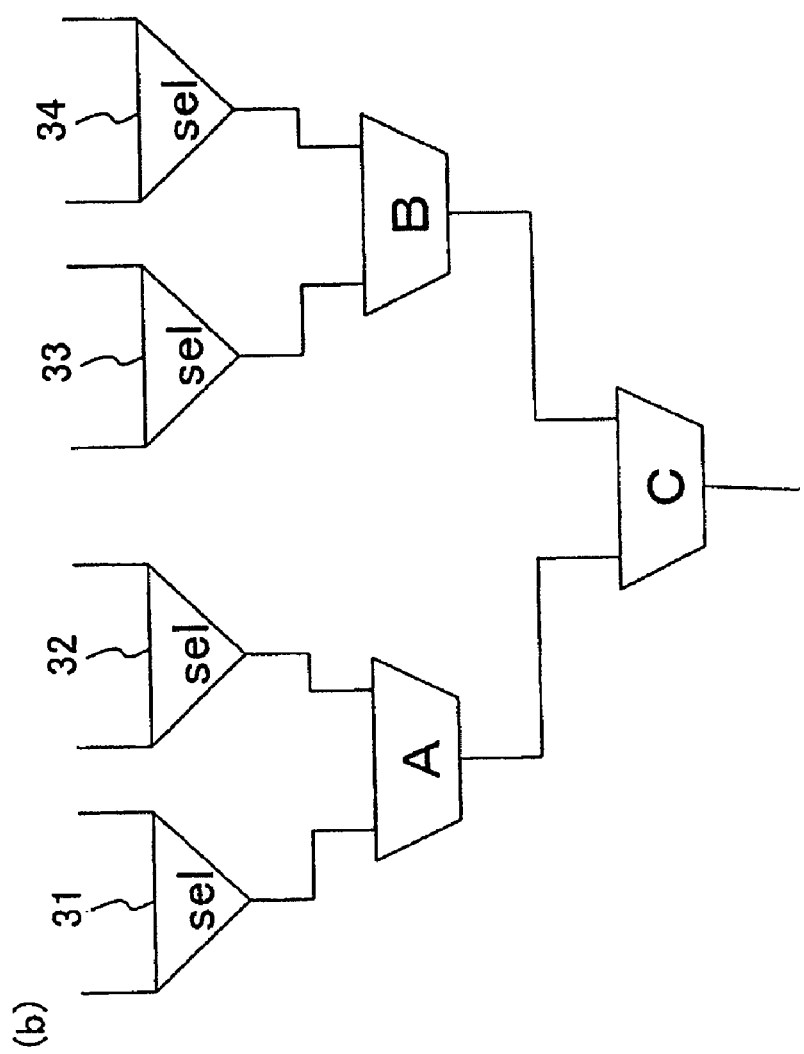
Figure 7:
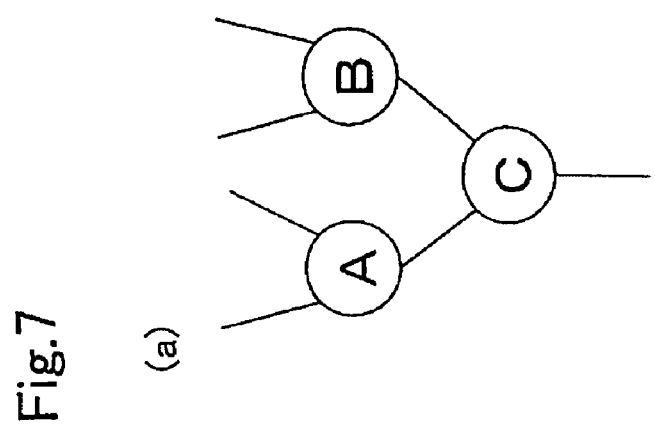

Portion (a) of FIG. 7 is a diagram showing an example of a data flow graph; and Portion (b) of FIG. 7 is a circuit diagram showing an example of implementing the behavior in Portion (a) of FIG. 7.

Figure 8:
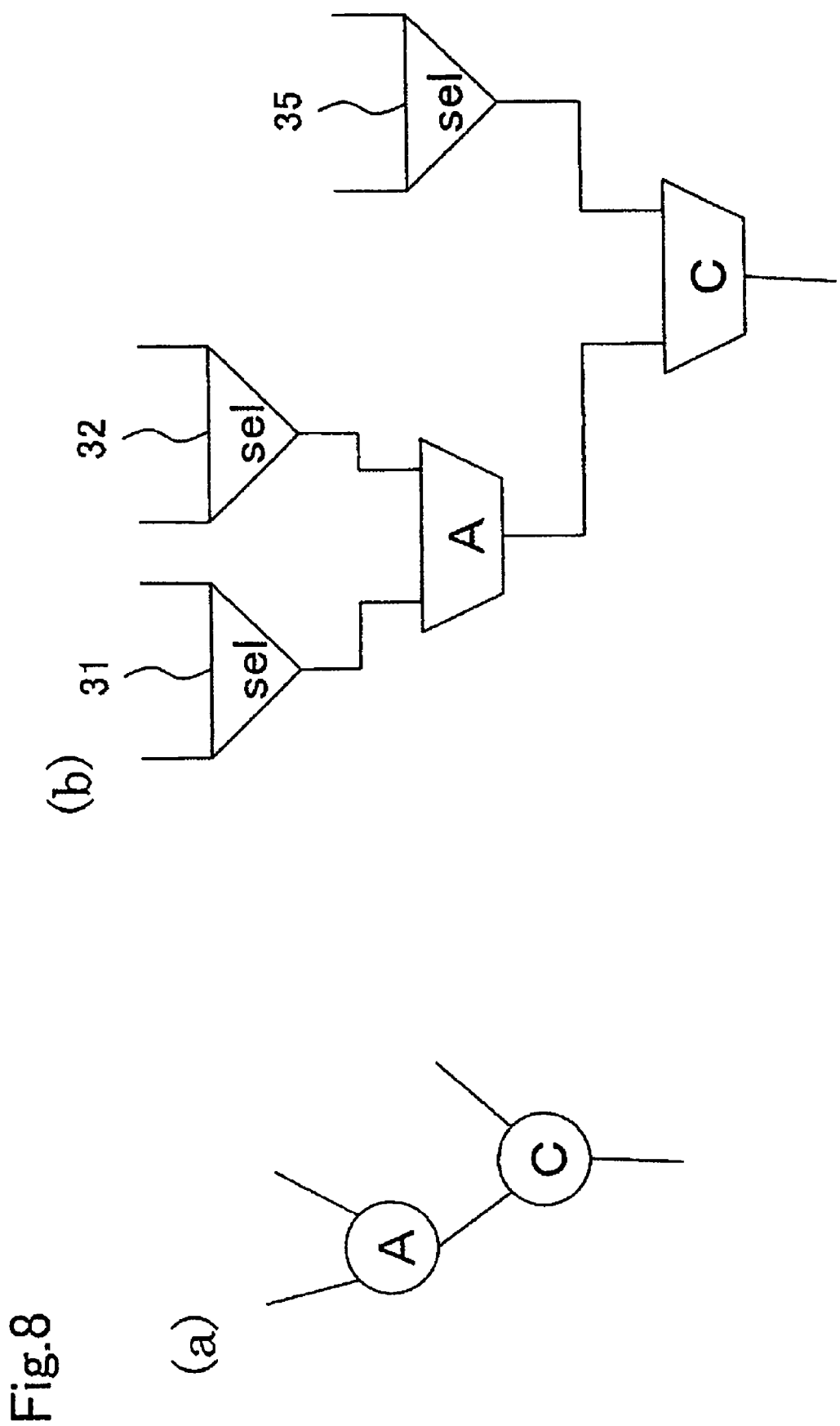

Portion (a) of FIG. 8 is a diagram showing an example of a data flow graph having a compacted input unit; and Portion (b) of FIG. 8 is a circuit diagram showing an example of implementing the behavior in Portion (a) of FIG. 8.

Figure 9:
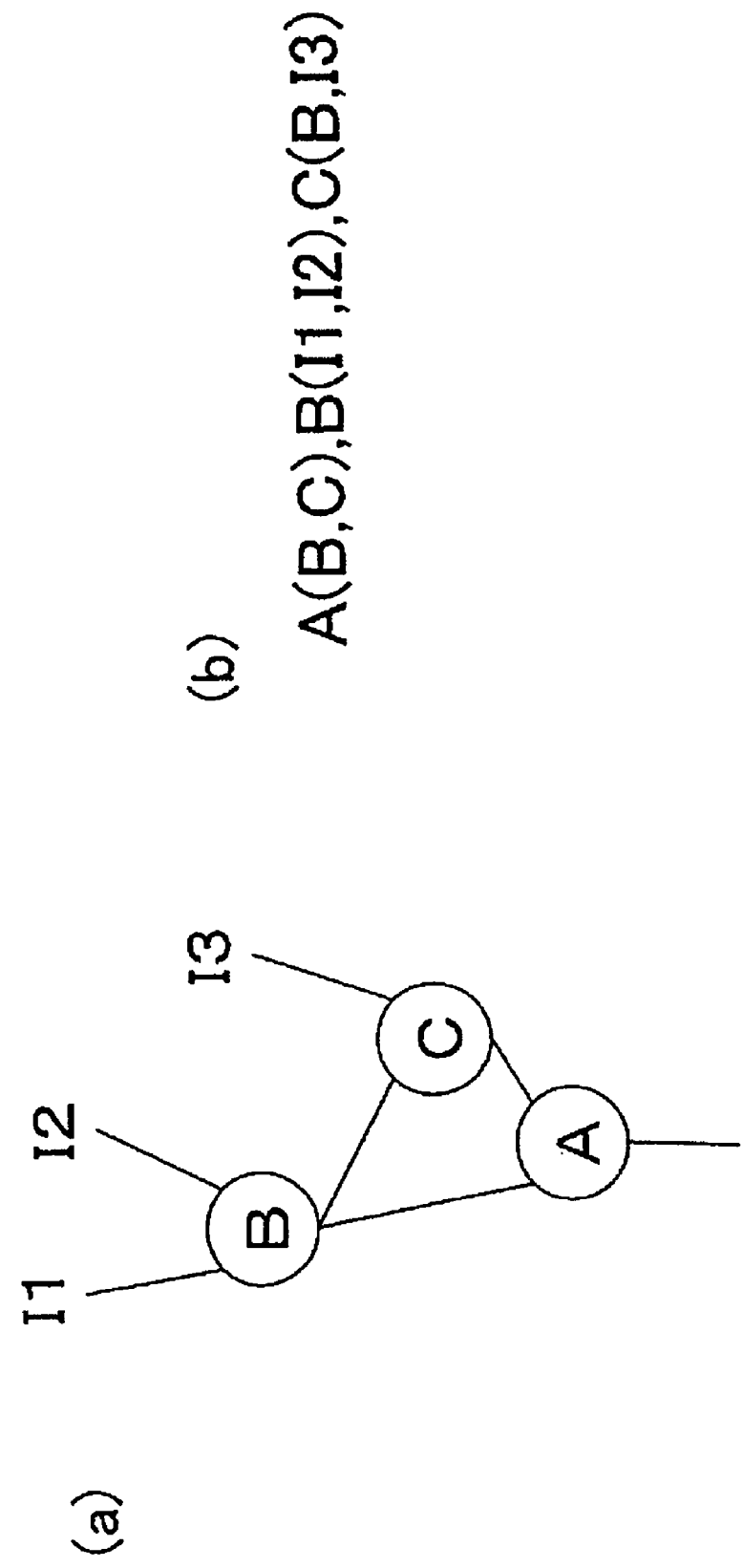

FIG. 9 is a diagram for describing an exemplary character string representation of a data flow graph; Portion (a) of FIG. 9 is a diagram showing an example of a data flow graph; and Portion (b) of FIG. 9 is a diagram showing an exemplary character string representation in Portion (a) of FIG. 9.

Figure 10:
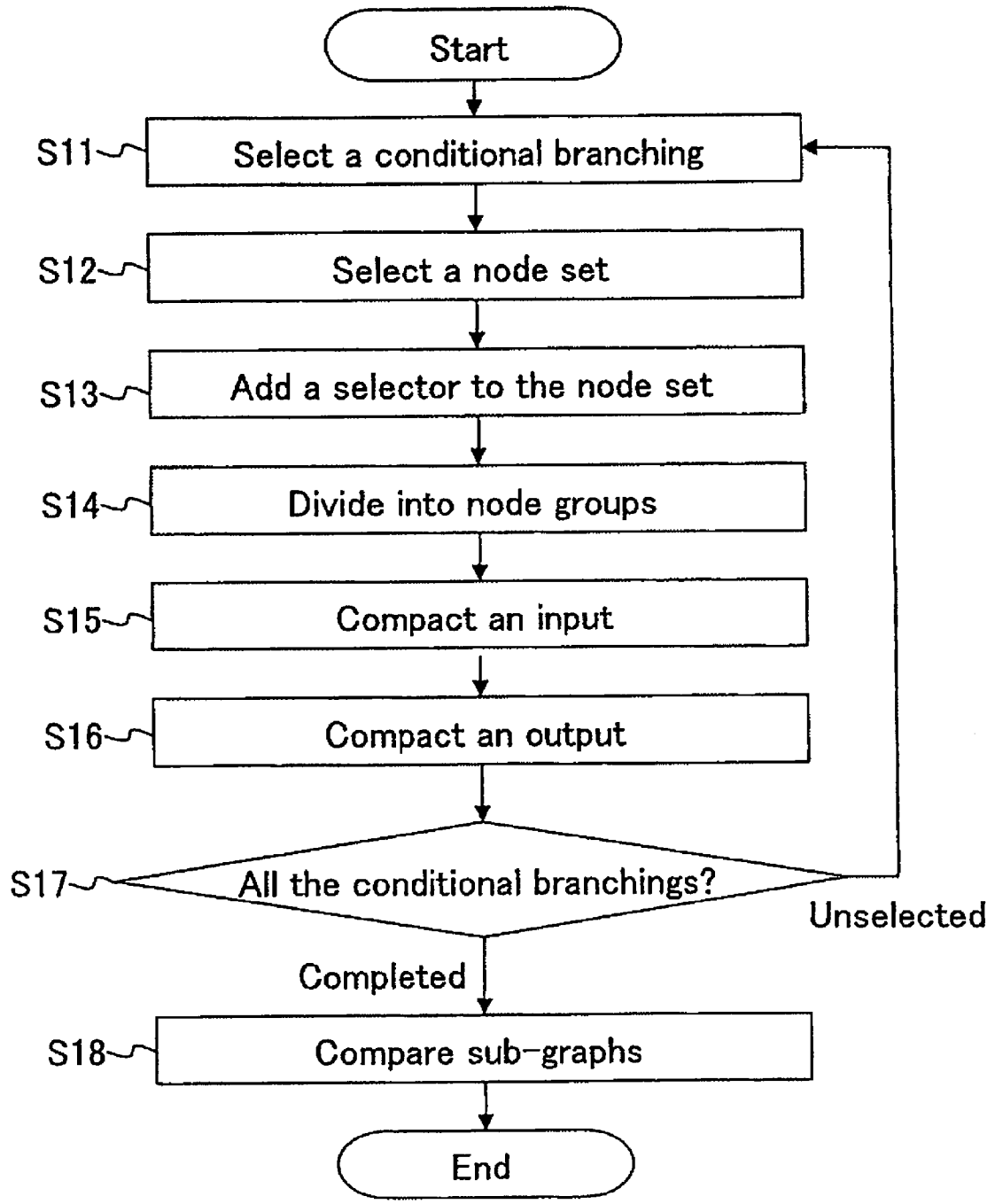

FIG. 10 is a flowchart for describing a processing procedure of a same sub-graph detection method for data flow graph according to Embodiment 2.

Figure 11:
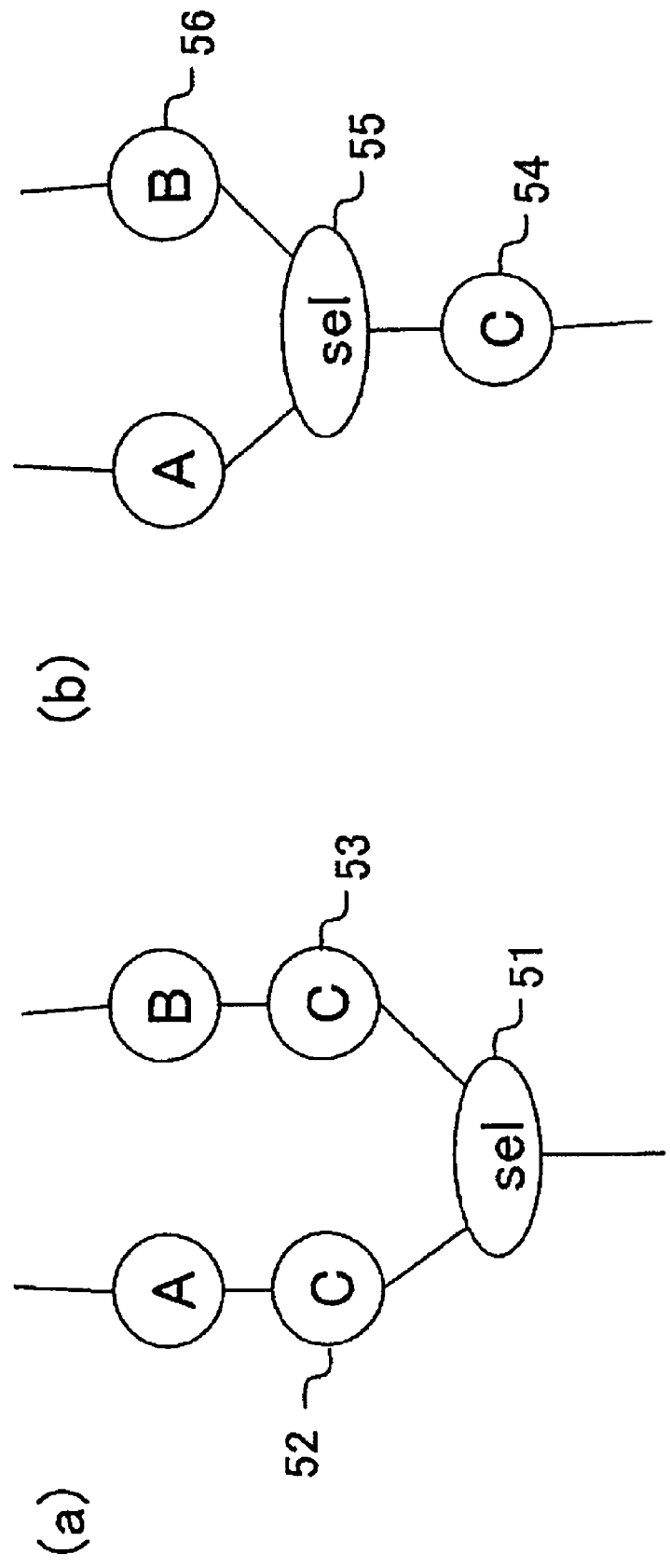

Portions (a) and (b) of FIG. 11 are diagrams for describing the compacting of an output unit.

Figure 12:
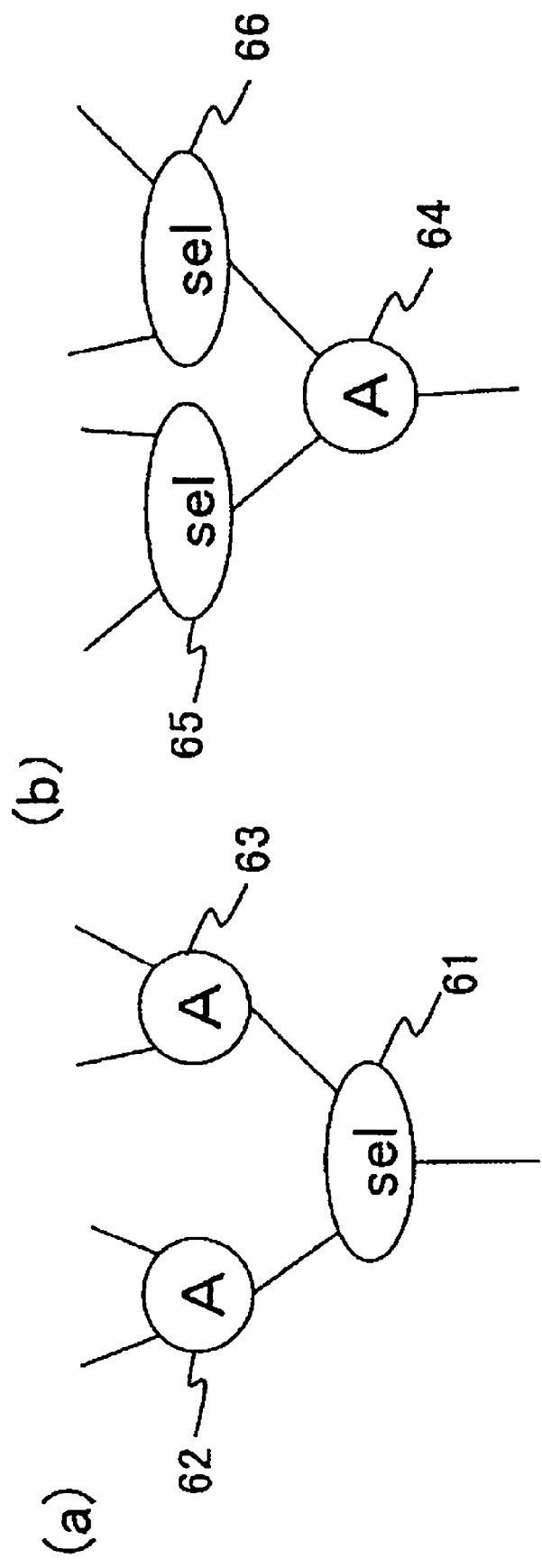

Portions (a) and (b) of FIG. 12 are diagrams for describing the compacting of an output unit.

Figures 13, 14:
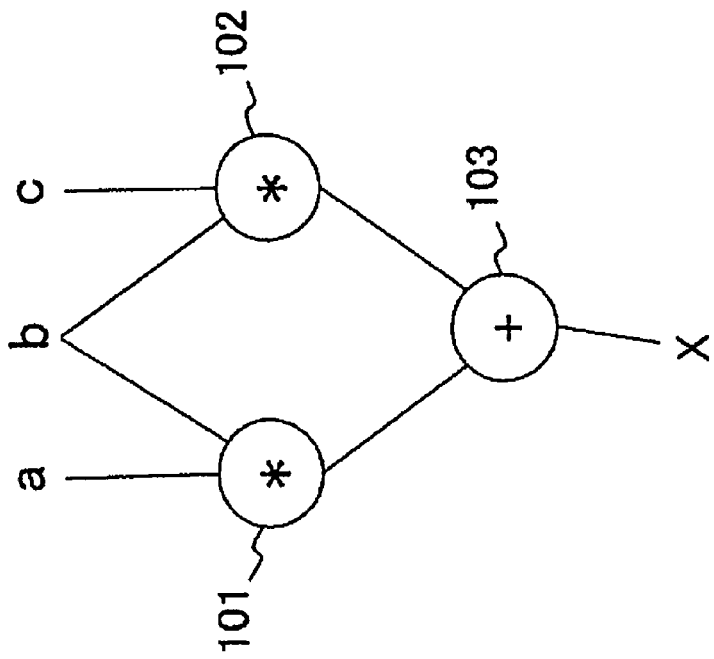

FIG. 13 is a diagram showing an example of a behavioral description.

FIG. 14 is a diagram showing an example of a data flow graph.

FIG. 15 is a diagram showing an example of a data structure which represents a data flow graph.

Figure 16:
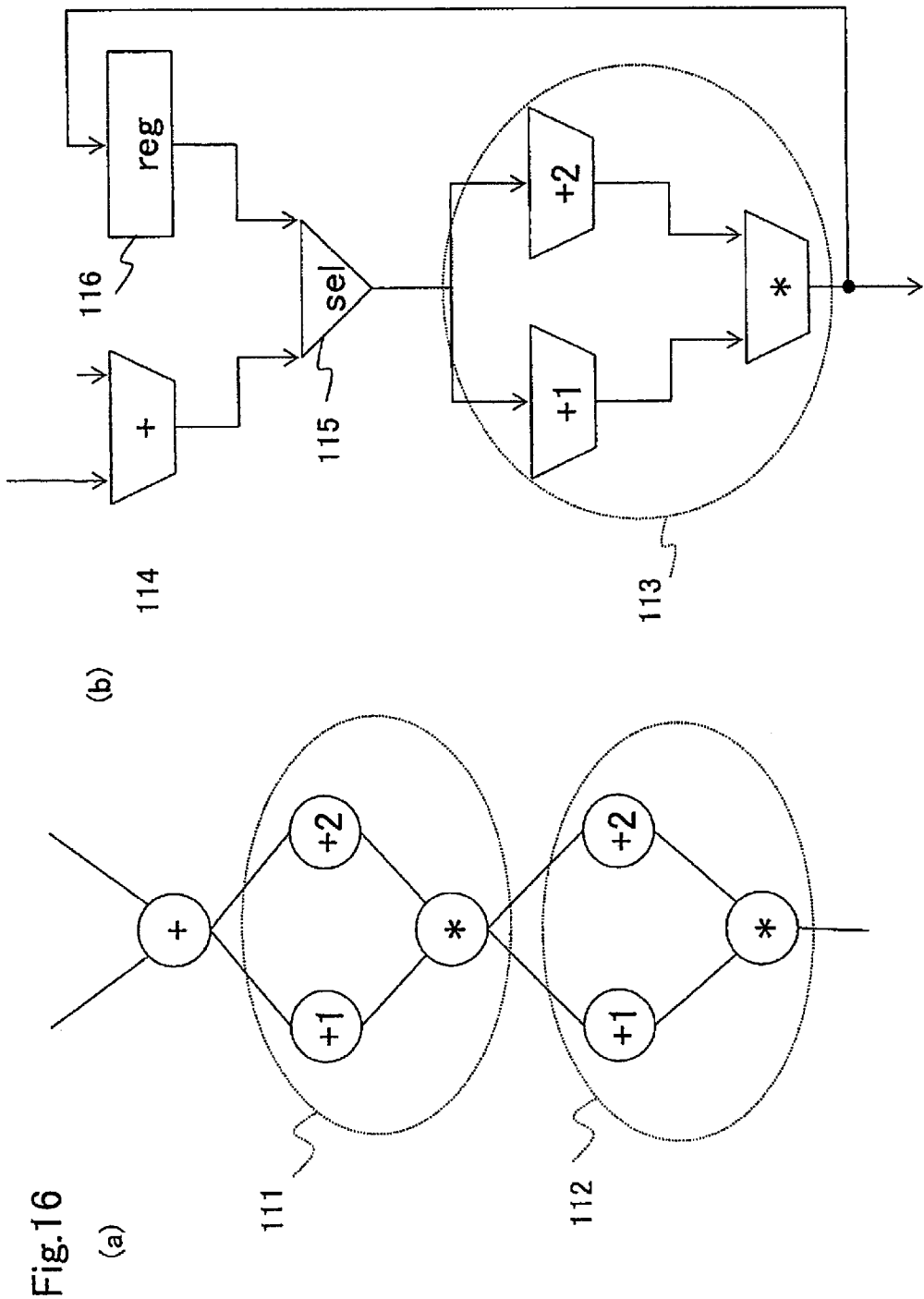

Portions (a) and (b) of FIG. 16 are diagrams for describing an example of the sharing of sub-graphs.

Figure 17:
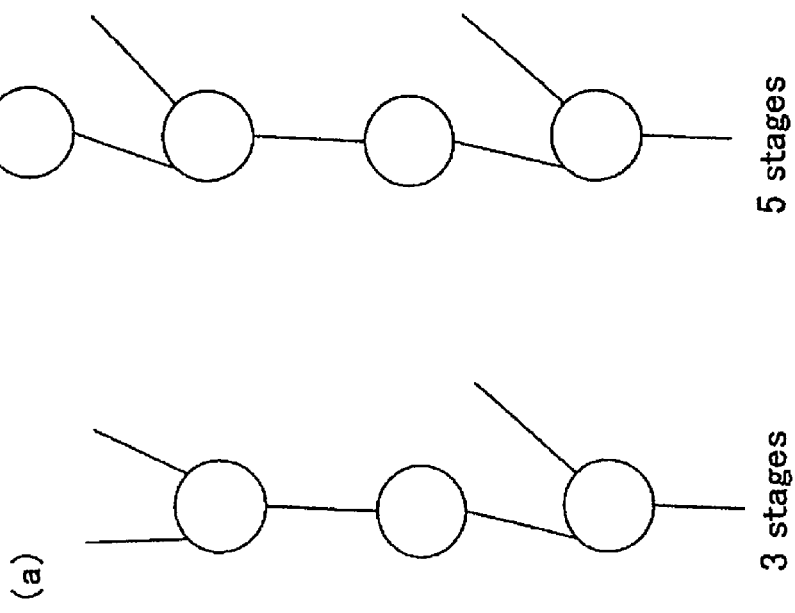

FIG. 17 is a diagram showing an example of a sub-graph handled by a conventional similar sub-graph searching method.

Figure 18:
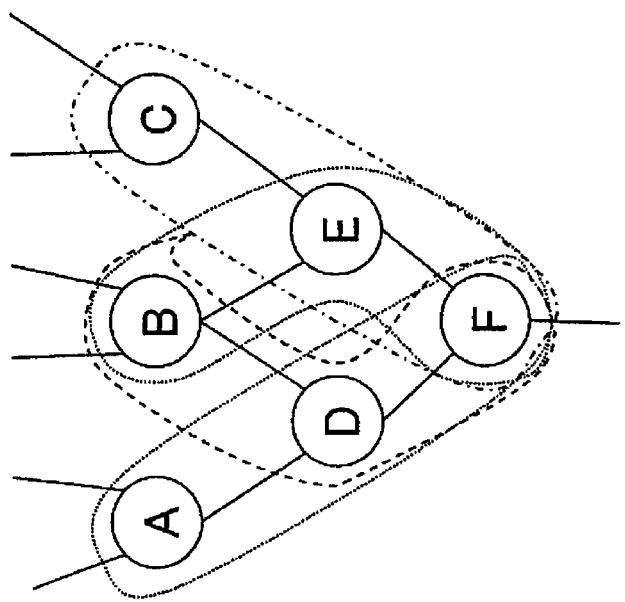

FIG. 18 is a diagram for describing the conventional similar sub-graph searching method.

Figure 19:
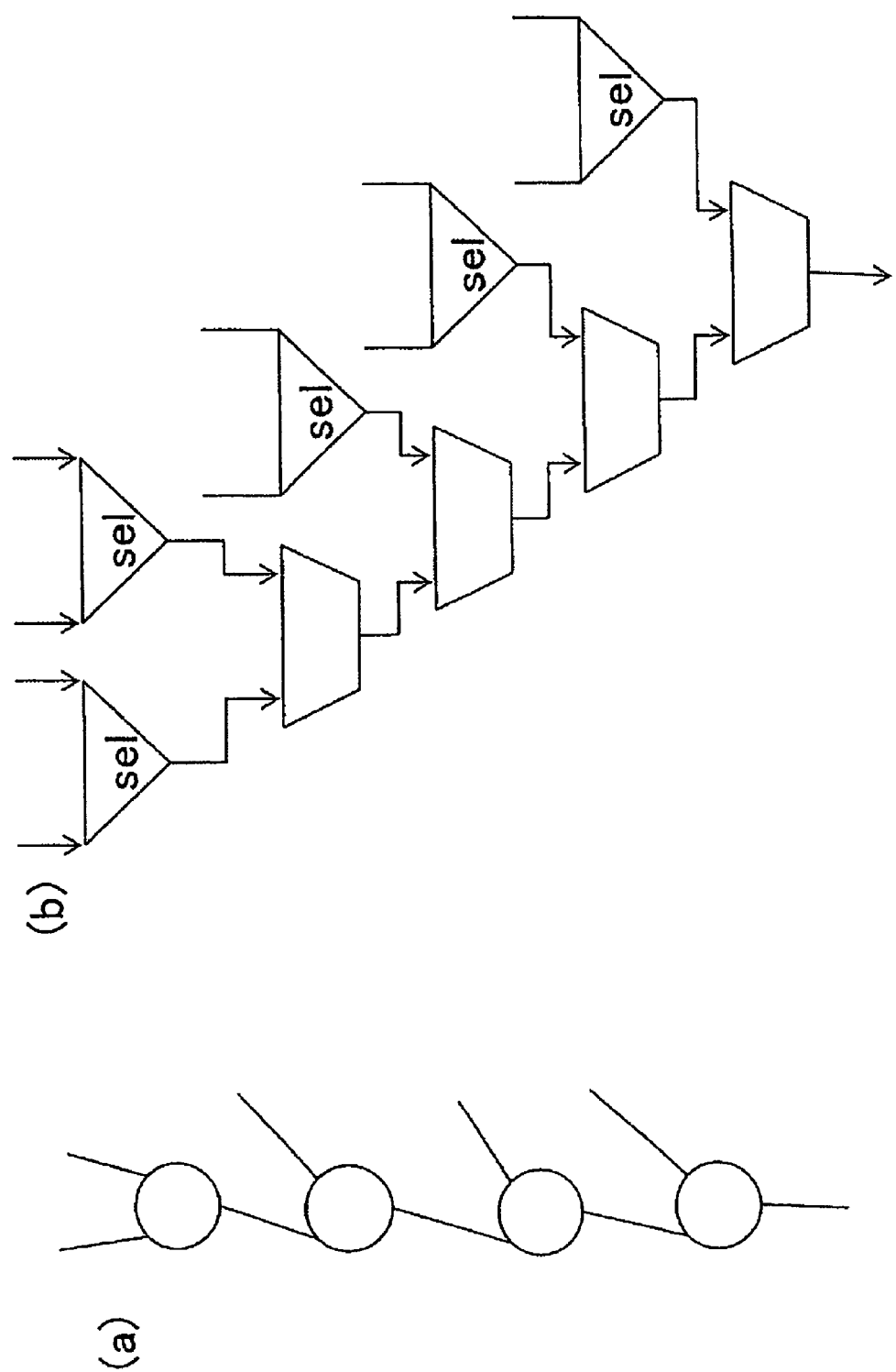

Portions (a) and (b) of FIG. 19 are diagrams for describing problems in the conventional similar sub-graph searching method.

Figure 20:
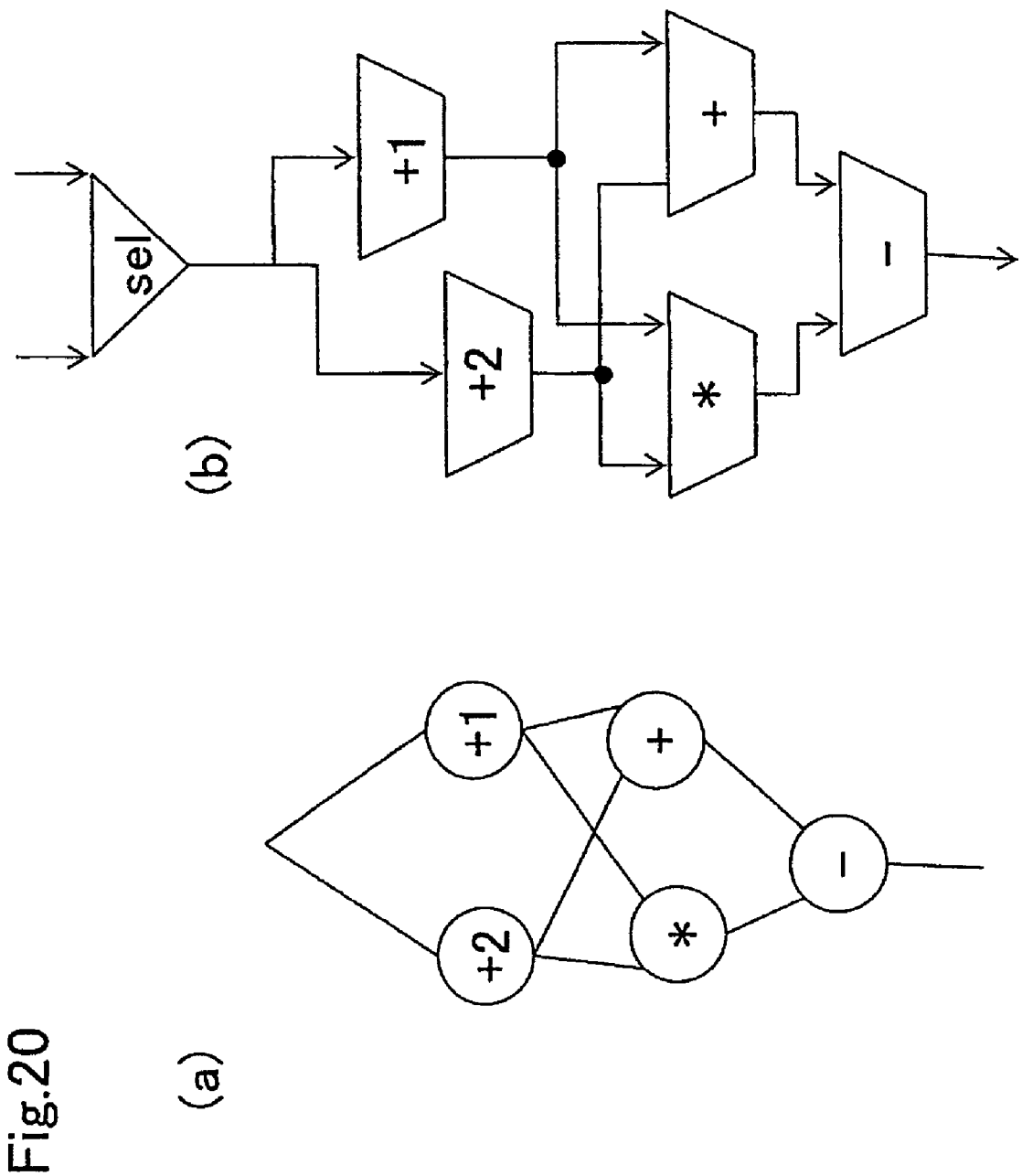

Portions (a) and (b) of FIG. 20 are diagrams showing an example of a sub-graph having a large area-size reduction effect due to the sharing of a circuit.

Figure 21:
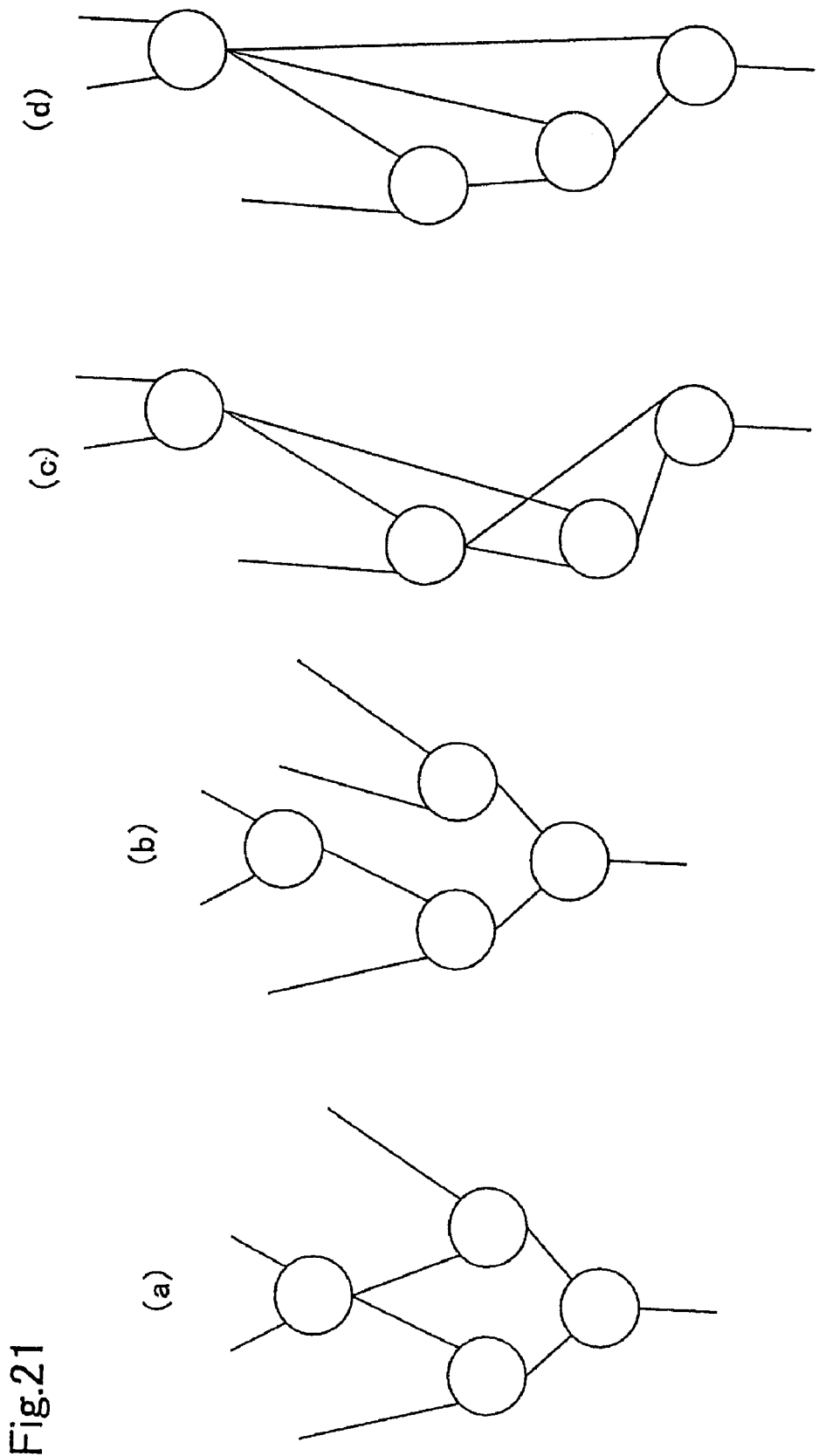

Portions (a) to (d) of FIG. 21 are diagrams showing exemplary shapes of various sub-graphs, respectively.

1 behavioral description storage unit
2 data flow graph generation section
3 database
4, 4A same sub-graph detection apparatus for data flow graph
41, 41A conditional branching selection section
42, 42A node set selection section
43, 43A node grouping section
44, 44A graph compacting section
45 sub-graph comparison section
5 same sub-graph detection result storage unit
10, 10A high-level synthesis apparatus

BEST MODE FOR CARRYING OUT THE INVENTION

Hereinafter, first, a data flow graph including a conditional branching targeted in order to effectively search the same sub-graph will be described before Embodiments 1 and 2 for a same sub-graph detection apparatus for data flow graph, and a same sub-graph detection method for data flow graph using the same sub-graph detection apparatus according to the present invention will be described with reference to the accompanying drawings.

In the present invention, in order to effectively search the same sub-graph from the data flow graph, a hierarchical structure in the data flow graph (e.g., loop and conditional branching) is targeted. The data flow graph of the loop includes a conditional branching for determining the continuation of the processing. As such, the conditional branching will be targeted and described hereinafter.

Figure 1:
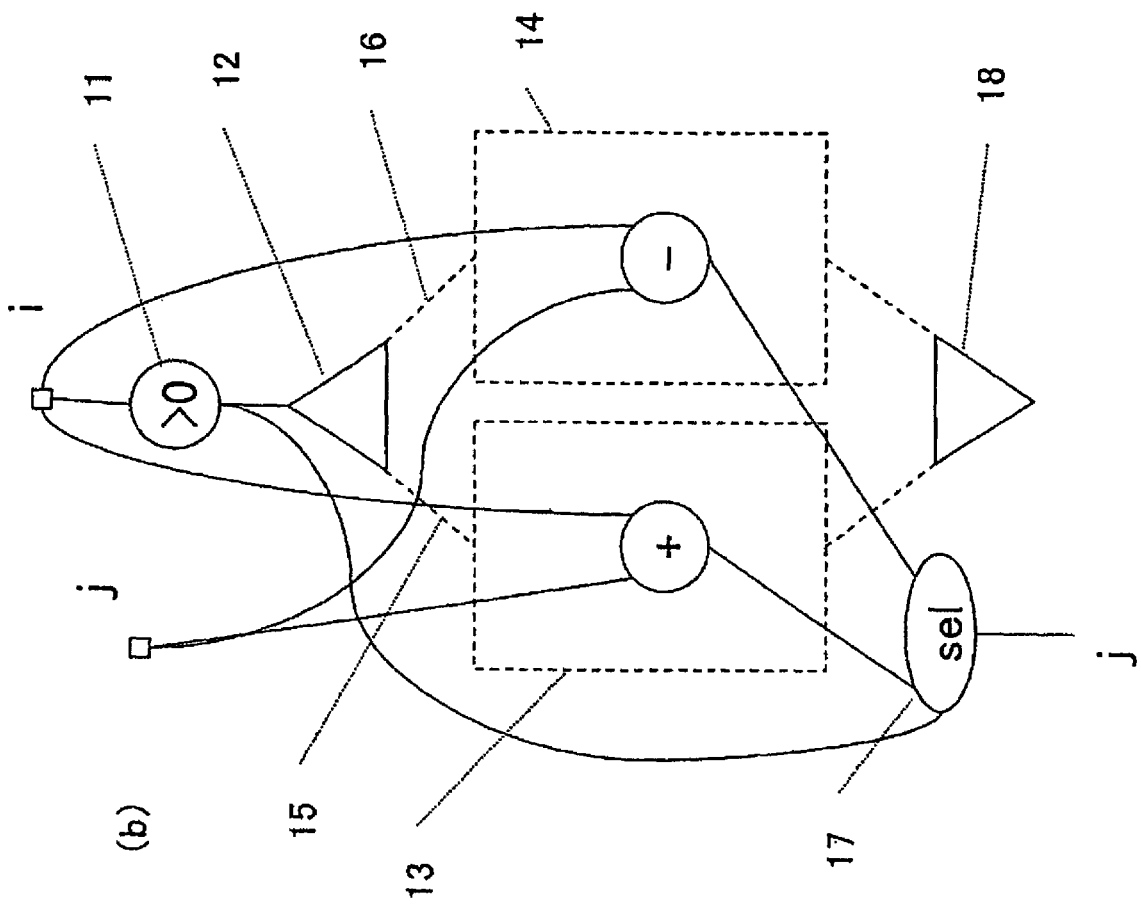

Portion (a) of FIG. 1 is an example of a behavioral description with C language, including the conditional branching which is targeted in the present invention.

Portion (b) of FIG. 1 is a diagram showing an example of the data flow graph of Portion (a) of FIG. 1.

As shown in Portion (b) of FIG. 1, a comparator 11 is a comparator for determining a condition (i>0) of the conditional branching. The result of the comparison is input to a branching node 12.

A control signal is generated at the branching node 12 such that a block 13 is executed when an input is, for example, "1" and a block 14 is executed when an input is, for example, "0". This control signal is represented as a flow of data by control branches 15 and 16 in a broken line.

The block 13 represented in the broken line is a block in which an internal data flow graph is executed when the condition is "true". Hereinafter, this block is called true block. The block 14 is a block which is executed when the condition is "false". Hereinafter, this block is called false block.

Each of the outputs from the blocks 13 and 14 is input to a selector node 17. Depending on a condition, either the processed result of the true block 13 or the processed result of the false block 14 is selected. A node 18 is a connection node where the true block and the false block in the conditional branching converge.

In this data flow graph, when i>0, the data flow graph in the true block 13 is executed, and a value of j+i is output as a new j. When i< or =0, the data flow graph in the false block 14 is executed, and a value of j−i is output as a new j.

A data flow graph including such a control signal is called control data flow graph (CDFG). Herein, it is simply called data flow graph.

Such a conditional branching is used many times in the behavioral description. There are often the cases in which similar processings are described in each conditional branching. Thus, by searching the vicinity of the conditional branching, it is possible to effectively detect the same sub-graphs. The loop includes the conditional branching for determining the continuation of the processing as well, as described above, which is similar to the case of the conditional branching described above.

Figure 2:
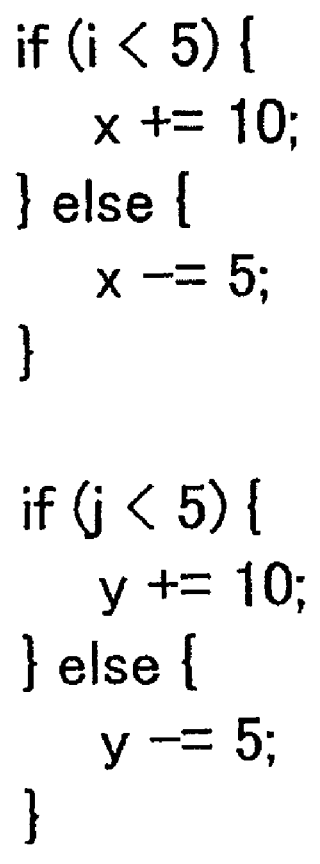

For example, a behavioral description with C language shown in FIG. 2 includes two conditional branchings. In the first conditional branching, a value of variable x is changed in accordance with a condition. In the second conditional branching, a value of variable y is changed in accordance with a condition. In this example, when i<5 in the first conditional branching, a value of x+10 is outputted as a new value of x, and when i> or =5, a value of x−5 is outputted as the new value of x. Also, when j<5 in the second conditional branching, a value of y+10 is outputted as a new value of y and when j> or =5, a value of y−5 is outputted the new value of y.

However, in this data flow graph, the names of the variables have no relationship to the data flow graph, and only the computations of the data are represented as graphs. As such, the same sub-graphs appear in both conditional branchings. Thus, by searching the vicinity of a conditional branching or a loop, it is possible to effectively detect the same sub-graphs.

Embodiment 1

Figure 3:
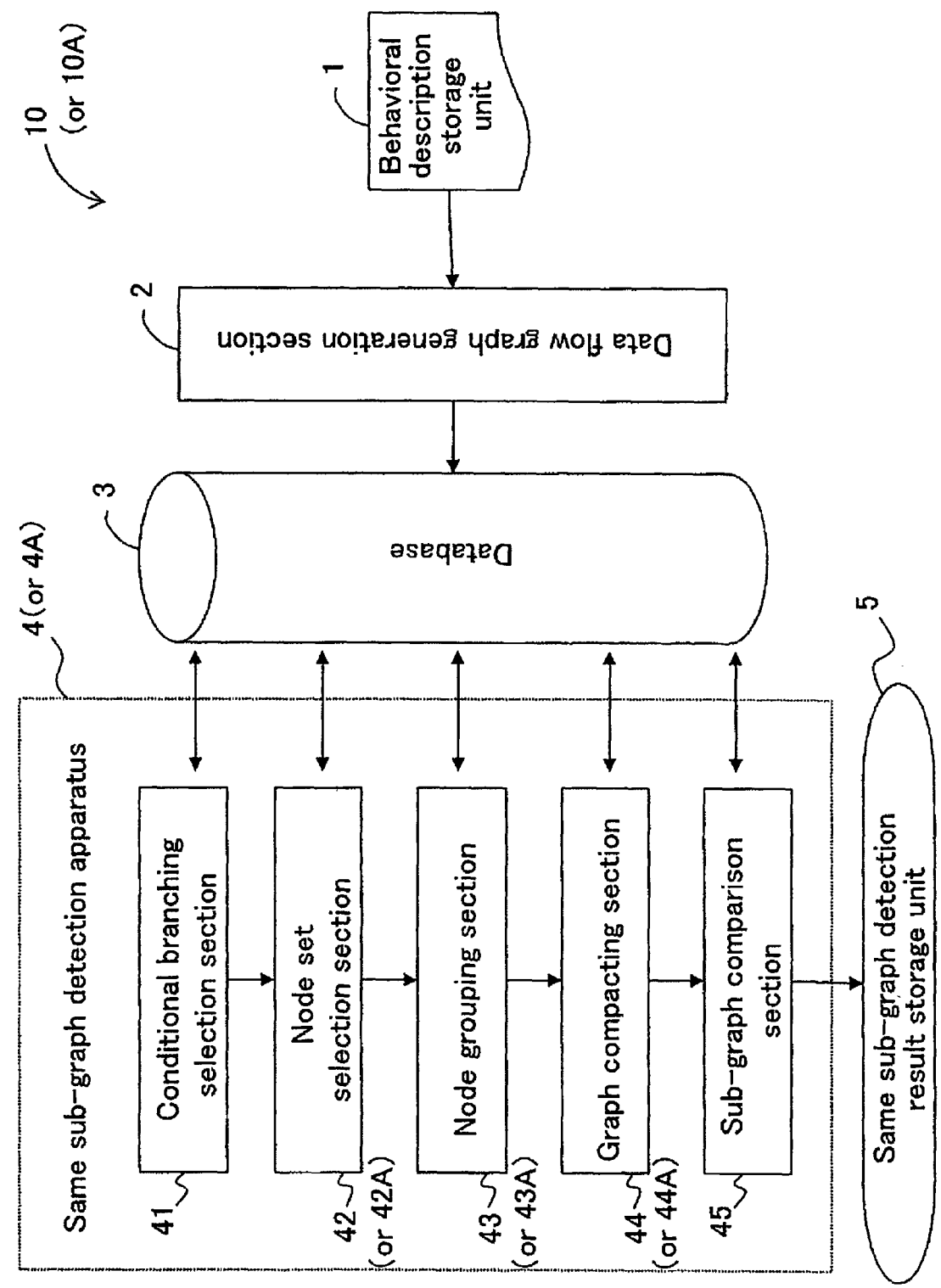
FIG. 3 is a block diagram showing an exemplary structure of a high-level synthesis apparatus including a same sub-graph detection apparatus for data flow graph according to Embodiment 1 of the present invention.

FIG. 3 is a block diagram showing an exemplary structure of a high-level synthesis apparatus including the same sub-graph detection apparatus for data flow graph according to Embodiment 1 of the present invention.

In FIG. 3, a high-level synthesis apparatus 10 according to Embodiment 1 includes: a behavioral description storage unit 1 for storing a behavioral description for a digital circuit; a data flow graph generation section 2 for generating a data flow graph from a predetermined behavioral description; a database 3 for storing the generated data flow graph; a same sub-graph detection apparatus 4 for data flow graph for accessing the database 3; and a same sub-graph detection result storage unit 5 for storing the detected same sub-graph. The high-level synthesis apparatus 10 performs a scheduling process and an allocation process on the data flow graph. Based on the scheduling result and the allocation result, the high-level synthesis apparatus 10 generates a data path and a controller so as to obtain hardware (circuit diagram), which, however, has no direct relationship with the present invention. Thus, the description thereof will be omitted.

The data flow graph generation section 2 analyzes a flow of data and creates a model called data flow graph from a behavioral description, which only describes an algorithm for processing but does not include information regarding the structure of the hardware. This data flow graph is structured with a plurality of nodes representing respective processings and branches connecting the nodes. A node represents one computation performed in the digital circuit. A branch represents the flow of data from one computation (node) to another computation (node). By appropriately connecting branches with nodes representing computations, it is possible to represent the behavior of the digital circuit as the data flow graph. Each node in the data flow graph is connected by an input branch and an output branch. The input branch represents data to be given for computation. The output branch represents data obtained as a result of the computation. In addition, each node includes information regarding the type of a computation and the like.

The database 3 stores the data flow graph generated by the data flow graph generation section 2.

The same sub-graph detection apparatus 4 for data flow graph includes: a conditional branching selection section 41; a node set selection section 42; a node grouping section 43; a graph compacting section 44 and a sub-graph comparison section 45. In the sub-graph detection apparatus 4 for data flow graph, a data flow graph in the database 3 is made reference to, and the same sub-graphs in the data flow graph are detected.

The conditional branching selection section 41 selects one conditional branching in an arbitrary order from one or a plurality of conditional branchings in the data flow graph in the database 3.

The node set selection section 42 selects a node set included in a conditional branching selected by the conditional branching selection section 41.

The node grouping section 43 divides the node set selected by the node set selection section 42 into several groups.

The graph compacting section 44 compacts input units and output units of the groups divided by the node grouping section 43 and outputs the groups as a sub-graph.

The sub-graph comparison section 45 compares a plurality of sub-graphs, which is obtained as a result of each processing on the conditional branchings by the conditional branching selection section 41, the node set selection section 42, the node grouping section 43 and the graph compacting section 44, and detects the same sub-graphs.

Hereinafter, the same sub-graph detection method for data flow graph using the same sub-graph detection apparatus 4 for data flow graph according to Embodiment 1 will be described in a concrete manner.

Figure 4:
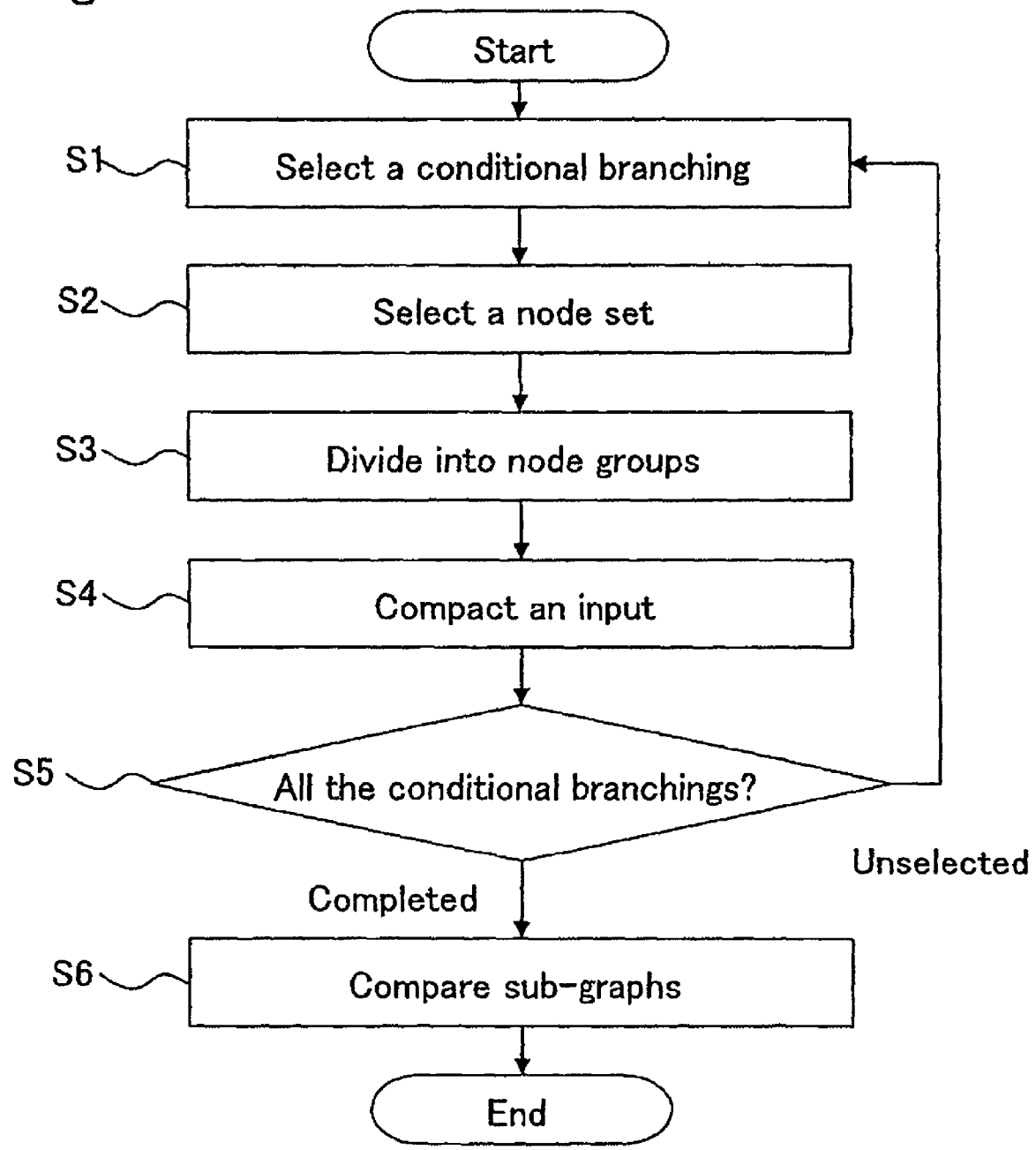
FIG. 4 is a flowchart for describing a processing procedure of a same sub-graph detection method for data flow graph according to Embodiment 1.

FIG. 4 is a flowchart for describing a processing procedure of the same sub-graph detection method for data flow graph using the same sub-graph detection apparatus 4 for data flow graph in FIG. 1. Hereinafter, each processing procedure of the same sub-graph detection method for data flow graph according to Embodiment 1 will be described in accordance with the flowchart in FIG. 4.

As shown in FIG. 4, first, in step S1, one conditional branching in the data flow graph is selected by the conditional branching selection section 41 in FIG. 3. The processings of step S1 to S4 are repeatedly performed on all the conditional branchings. Thus, the order of selecting one conditional branching from a plurality of conditional branchings can be arbitrary.

Next, in step S2, a node set included in the conditional branching selected in step S1 is selected by the node set selection section 42. For the node set included in this conditional branching, a node included in a true block executed when a condition of the conditional branching is "true", and a node included in a false block executed when the condition of the conditional branching is "false" are selected.

Figure 5:
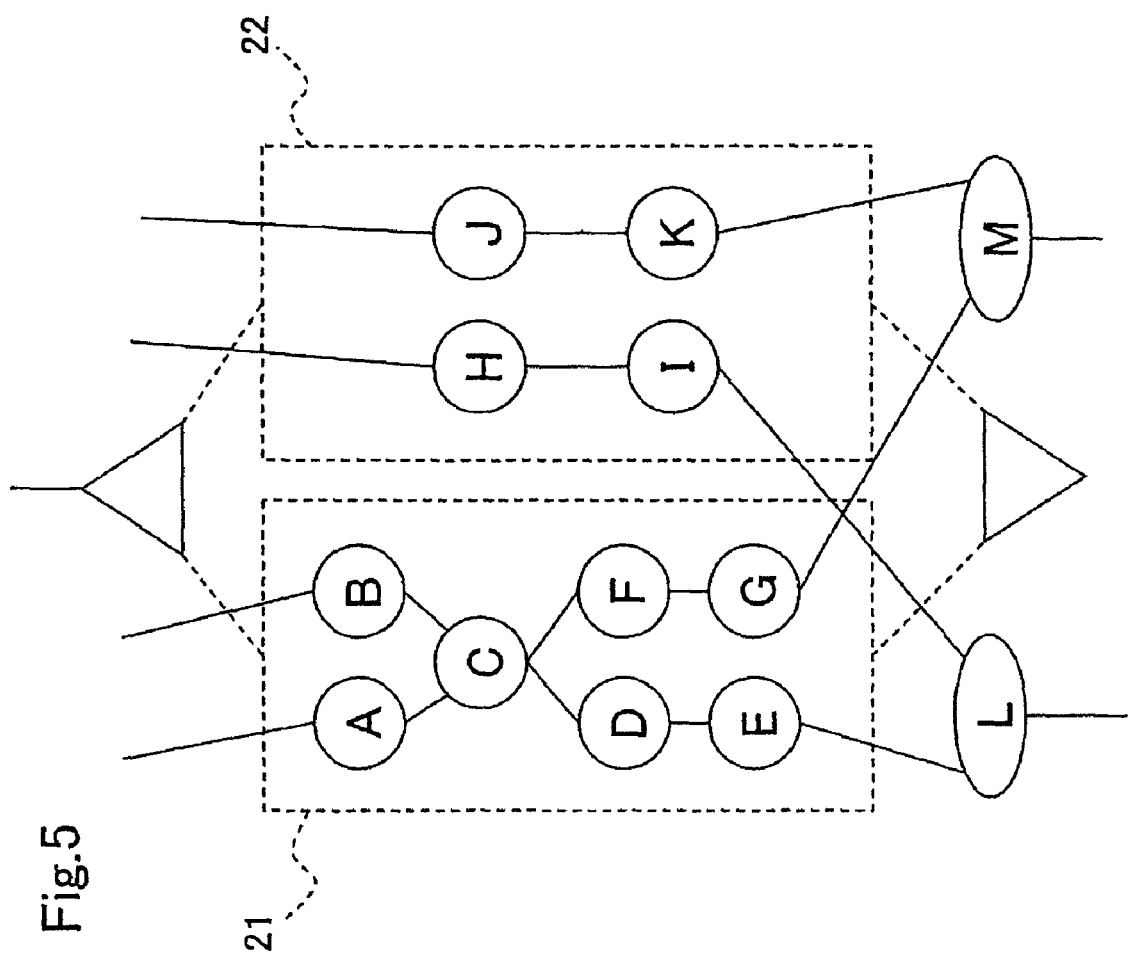
FIG. 5 is a diagram showing an example of a data flow graph including the conditional branching which is targeted in the present invention.

For example, in the case of the data flow graph including a conditional branching shown in FIG. 5, nodes A, B, C, D, E, F, G, which are included in a true block 21, and nodes H, I, J, K, which are included in a false block 22, are selected. Here, nodes L and M are selector nodes, and in Embodiment 1, they are not selected as part of node sets. In FIG. 5, a control signal for selector is omitted.

In step S3, the node set selected in step S2 is divided into several groups by the node grouping section 43.

For an output node (last output node) that generates an output of the true block or the false block executed when the condition of the conditional branching is "true" or "false", a combination of computation nodes is obtained for the computation nodes included in the true block or the false block, wherein the computation nodes are connected to the output node and the outputs of the computation nodes have an affect on the output node. Node groups which are the same among the combinations of the nodes are made as another node group (a combination of nodes). Herein, a node which is located at the most downstream in a data flow graph or a sub-graph and which generates an output value of the entire graph is called output node.

The grouping is conducted, for example, by processing procedures (1) to (4) described in the following.

(1) An output node located at the last output side of the true block or the false block which is executed when the condition of the conditional branching is "true" or "false" is selected (last output node). For example, in the example shown in FIG. 5, nodes E, G, I, K are selected.

(2) For each of the last output nodes, nodes connected to the input branches of the last output node are obtained by searching the data flow graph in an upper direction (upstream). In this case, other nodes can be traversed through. For example, in the example shown in FIG. 5, the nodes connected to output node E are nodes A, B, C, D. The nodes connected to output node G are nodes A, B, C, F. In addition, the node connected to output node I is H, and the node connected to output node K is J.

(3) For each node, a set for an output node is obtained by determining whether the nodes are commonly connected. When the node is the output node, the node is connected to itself. For example, in the example shown in FIG. 5, nodes A, B, C are commonly connected to output nodes E and G. Nodes D, E are connected to output node E. In addition, nodes F, G are connected to output node G. In addition, nodes H, I are connected to output node I. In addiction, nodes J, K are connected to output node K.

(4) Nodes in the same set connected to the output node are made as one group. In other words, node groups which are the same among the combinations of the nodes are made as another node group (a combination of nodes). For example, in the example in FIG. 5, the nodes are divided into a group of nodes A, B, C, a group of nodes D, E, a group of nodes F, G, a group of nodes H, I and a group of nodes J, K.

As described above, by grouping nodes in accordance with a prescribed rule, when the same data flow graph exists at a different location, then exactly the same grouping is conducted. When a similar flow data graph exists at a different location, there is an increasing possibility that a common portion can be retrieved as a group.

Figure 6:
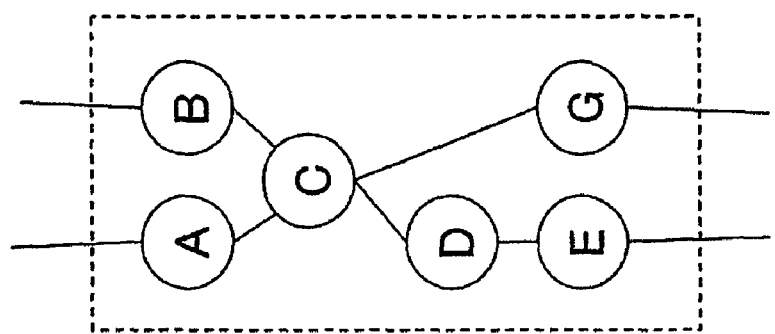
FIG. 6 is a diagram showing an exemplary data flow graph existing differently from the data flow graph in FIG. 5.

For example, FIG. 6 is a data flow graph similar to FIG. 5. In the entire data flow graph, when there are both data flow graph of the conditional branching as shown in FIG. 5 and data flow graph of a conditional branching included in a true block or a false block shown in FIG. 6, the nodes shown in FIG. 6 are divided into a group of nodes A, B, C, a group of nodes D, E and a group of node G only. The group of nodes A, B, C and the group of nodes D, B can be retrieved as the same sub-graphs in FIG. 5 and FIG. 6. Further, it is possible to retrieve a sub-graph having a branching, as in the case of the group of nodes A, B, C in FIG. 5 and FIG. 6.

Herein, the flowchart of FIG. 4 will be described again.

The node groups obtained in step S3 can be stored as sub-graphs in the database 3 as they are. However, here, there is a possibility that the node groups obtained in step S3 requires many selectors when a circuit is shared due to an increased number of inputs, as in the case of Portion (b) of FIG. 19. Therefore, in step S4, the input unit of the node group is made compact by the graph compacting section 44, and the number of selectors required when the circuit is shared is reduced.

For example, in step S3, node group A, B, C shown in Portion (a) of FIG. 7 is obtained. When this retrieved as a sub-graphs as it is, then in order to share the circuit shown in Portion (a) of FIG. 7 and use it at two locations, a circuit including four selectors 31 to 34, each having two inputs, is required, as shown in Portion (b) of FIG. 7.

When node B is removed from node group A, B, C in Portion (a) of FIG. 7, and node group A, C is made shown in Portion (a) of FIG. 8, then in order to share the circuit shown in Portion (a) of FIG. 8 and using it at two locations, a circuit including three input selectors 31, 32 and 35, each having two inputs, is required, as shown in Portion (b) of FIG. 8. Further, two computing units for executing the computation of node B are separately required although they are not shown in Portion (b) of FIG. 8.

Thus, when the circuit shown in Portion (b) of FIG. 7 and the circuit shown in Portion (b) of FIG. 8 are compared, the circuit shown in Portion (b) of FIG. 8 requires one more computing unit B and one less selector than the circuit shown in Portion (b) of FIG. 7.

In other words, when the area occupied by the computing unit B is larger than the area occupied by the selector, then the circuit in FIG. 7 is preferred. When the area occupied by the computing unit B is smaller than the area occupied by the selector, then the circuit in FIG. 8 is preferred.

Thus, targeting on each computation node located at an input unit of the node group, the sum of the area of a circuit for executing the sub-graph and the area of a selector required when the circuit is shared at a plurality of locations (for example, the circuit in FIG. 7) and the sum of the area of a circuit for executing a sub-graph with a targeted computation node removed from the sub-graph which includes the targeted computation node, the area of a selector required when the circuit is shared at a plurality of locations and the area of a computing unit required in order to execute the removed targeted computation node (for example, the circuit in FIG. 8) are compared. When the latter is smaller, then the targeted computing unit is removed from the sub-graph (the circuit in FIG. 8 is chosen as the sub-graph), and the input unit of the node group is made compact.

Further, when the number of bits is different between an input and an output of a computation, then in the case of the selector, it is necessary to consider not only the number, but also the size of the area. For example, the bit width of the selectors 31 and 32 in Portion (b) of FIG. 7 is different from that of the selector 35 shown in Portion (b) of FIG. 8. Thus, there is a possibility that the sizes of the areas are different from each other.

Generally, for targeted computation node F, when
(area of a selector for the number of input bits of computing unit F)×(number of inputs)>(area of computing unit F)+(area of a selector for the number of output bits of computing unit F)×(number of outputs), it is preferable to remove targeted computation F.

In step S4 in FIG. 4, the processing procedure described above is repeatedly applied to each node at an input unit of a sub-group.

In other words,
(1) When nodes are connected to nodes, all of the inputs which are not connected to a node group are made as set S.
(2) For a node representing one computation F in set S, when
(area of a selector for the number of input bits of computing unit F)×(number of inputs)>(area of computing unit F)+(area of a selector for the number of output bits of computing unit F)×(number of outputs), then that node is removed from the node group, and if nodes are connected to nodes, all of the inputs which are not connected to the node group occur, then they are added to set S.
(3) Computation F is removed from set S.
(4) (2) and (3) described above are repeated unit set S becomes empty.

As described above, the node groups obtained in step S4 are stored as sub-graphs in the database 3. Hence, sub-graphs, in which the number of selectors required when a circuit is shared is small and a sharing effect is large, are obtained.

Next, in step S5 in FIG. 4, the processings of steps S2 to S4 are repeated so as to be performed on all of the conditional branchings.

Further, in step S6, the plurality of sub-graphs stored in the database 3 due to the processings of step S1 to S5 are compared by the sub-graph comparison section 45, and the same sub-graphs are detected.

Herein, the shape of each of the sub-graphs can be compared with each other in order to detect the same sub-graphs. However, it is necessary to compare all the features, such as the connections between the nodes and the branches and information of computation types of the nodes. Therefore, each comparison is complex, and it takes time for the processing.

In order to detect the same sub-graphs by comparing the sub-graphs, a method of using a character string is more effective, as shown below. This is shown in procedures (1) to (3).
(1) Each sub-graph is represented in a character string.
(2) Each sub-graph is sorted using the character string as a key.
(3) Character strings adjacent to each other are compared, and when the character strings adjacent to each other are equal to each other, they are outputted as the same sub-graph.

First, sub-graphs are represented in character strings. The method of representing sub-graphs in character strings can vary as long as the shapes of the sub-graphs and the character strings demonstrate one to one correspondence. Also, the sub-graphs can be represented in number strings (the number strings are included in the character strings described herein).

FIG. 9 shows an example of a method of representing the sub-graphs in the character strings.

Portion (a) of FIG. 9 is an example of the data flow graph. Portion (b) of FIG. 9 is an example of representing Portion (a) of FIG. 9 in character string.

The character string in Portion (b) of FIG. 9 can be divided into three parts, including A(B,C), B(I1,I2), C(B,I3), and each part indicates the type of each node and the connection point, to which the input of each node is connected. In other words, character string A(B,C) indicates that the first input of node A is connected to node B and the second input of node A is connected to node C. Character string B(I1, I2) indicates that the first input of node B is a first input for the sub-graph and the second input of node B is a second input for the sub-graph. In addition, character string C(B, I3) indicates that the first input of node C is connected to node B and the second input of node C is a third input for the sub-graph.

Portion (b) of FIG. 9 is a figure showing that each part of character string A(B,C), character string B(I1, I2) and character string C(B,I3) is arranged in the order of the depth priority and the left-side priority, starting from the output of the sub-graph shown in Portion (a) of FIG. 9.

When the sub-graph is represented in the character string in this manner, the appearance order of each node is uniquely determined. Thus, it is possible to make the shapes of the sub-graphs and the character strings to have one to one correspondence. In practice, information regarding the type of the computation of each node and information regarding a bit width are embedded in a character string.

Next, character strings are sorted in the order of a character code. In order to sort the character strings, it is possible to use a common algorithm, such as a quick sort.

Next, based on the result of the sorting, the character strings adjacent to each other are compared. If they are the same character strings, then it is determined that two sub-graphs corresponding to the character strings are the same. Since the character strings have been sorted, the same character strings are always adjacent to each other. Thus, only the character strings adjacent to each other have to be compared.

Here, when the number of nodes included in a sub-graph is increased, a character string becomes long, thus resulting in a possibility of taking time for the sort and comparison of the character strings. In such a case, with the use of a hash function (e.g., MD5) used for authentication and digital signature, it is possible to use a hash value generated from each character string, instead of the character string. MD5 is standardized as RFC1321 in IETF (Internet Engineering Task Force).

Since the hash value is by far shorter than the original character string, it is possible to shorten the time for conducting the sort and the comparison.

In a method using MD5, a hash value similar to a pseudo random number is generated by one-way function having an irreversible initial value sensitivity. Therefore, it is extremely difficult to create different original character strings which result in the generation of the same hash values, and the possibility of obtaining the same hash values from different original character strings is so small that it can be ignored.

Accordingly, when hash values are equal to each other, then original character strings are equal to each other, and it is possible to detect the same sub-graphs by detecting the same character strings in a short time.

As described above, according to Embodiment 1, one conditional branching is selected from a data flow graph, a node set included in the selected conditional branching is selected, and the selected node set is divided into several groups. These processings are performed on each conditional branching. Using each of the divided groups as a sub-graph, a plurality of sub-graphs is compared with each other so as to detect the same sub-graphs, and the vicinity of the conditional branching is searched. Thus, it is possible to easily and accurately find the same sub-graphs in a more effective manner.

In addition, by grouping nodes in accordance with a prescribed rule, it is possible to easily and accurately detect the same sub-graphs by performing exactly the same grouping thereon when the same data flow graph exists at a different location; and by retrieving a common portion therefrom as a group when a similar data flow graph exists at a different location.

Further, by making an input unit of the sub-graph compact, it is possible to reduce the number of selectors required when a circuit is shared in order to reduce the circuit-occupied area.

Further, when sub-graphs are compared, it is possible to more effectively detect the same sub-graphs by comparing character strings or hash values.

Hence, according to Embodiment 1, by accurately detecting the same sub-graphs in the data flow graph at a high speed and processing the plurality of same sub-graphs using a shared circuit, it is possible to prevent the increase of the area of hardware and the increase of a cost.

Further, it is possible to obtain sub-graphs to be detected, in which the number of selectors required when sharing a circuit for processing the sub-graphs is small and an area-size reduction effect due to the sharing is large.

Embodiment 2

In the flowchart of FIG. 4 described in Embodiment 1, in step S2, nodes in a true block and a false block are selected as a node set included in a conditional branching. Embodiment 2 is a case in which a selector node, which selects an output from the true block that is executed when the condition of the conditional branching is "true" and selects an output from the false block that is executed when the condition of the conditional branching is "false", is added to a node set.

As shown in FIG. 3, a high-level synthesis apparatus 10A according to Embodiment 2 includes a same sub-graph detection apparatus 4A for data flow graph. The same sub-graph detection apparatus 4A for data flow graph includes: the conditional branching selection section 41; a node set selection section 42A; a node grouping section 43A; a graph compacting section 44A and the sub-graph comparison section 45. In the sub-graph detection apparatus 4A for data flow graph, the data flow graph in the database 3 is made reference to, and the same sub-graphs in the data flow graph are detected.

The node set selection section 42A selects a node included in a true block executed when the condition of the conditional branching is "true" and a node included in a false block executed when the condition of the conditional branching is "false" as a node set. In this case, the selector node, which selects the output from the true block that is executed when the condition of the conditional branching is "true" and the output from the false block that is executed when the condition of the conditional branching is "false", is added to the node set.

Using the selector node as an output node, the node grouping section 43A obtains a combination of computation nodes for the computation nodes included in the true block or the false block, wherein the outputs of the computation nodes have an affect on an output node; and divides combinations of the computation nodes for the output nodes into node groups, which are the same among the combinations of the computation nodes for the output nodes, and node groups said computation nodes.

When an output node of a group divided by the node grouping section 43A is a selector node and a plurality of computation nodes connected to an input side of the selector node are all of the same computation, the graph compacting section 44A compares the area occupied by a circuit for executing a sub-graph having the computation nodes of the same computation type connected to the input side of the selector node to the area occupied by a circuit for executing another sub-graph having an output of the selector node connected to the input side of one computation node of the same type. When the area occupied by the former is larger, the sub-graph is changed such that the output of the selector node is connected to the input side of the one computation node of the same type.

FIG. 10 is a flowchart for describing a processing procedure of the same sub-graph detection method for data flow graph according to Embodiment 2. Hereinafter, each processing procedure of the same sub-graph detection method for data flow graph according to Embodiment 2 will be described in accordance with the flowchart in FIG. 10.

As shown in FIG. 10, first, in step S11, as in the case of step S1 in FIG. 4, one conditional branching in the data flow graph is selected in a predetermined or arbitrary order by the conditional branching selection section 41.

Next, in step S12, as in the case of step S2 in FIG. 4, a node set included in the conditional branching selected in step S11 is selected by the node set selection section 42A. Thereafter, in step S13, the selector node for selecting the output from the conditional branching is added to the node set.

For example, in the case of the data flow graph shown in FIG. 5, for the node set included in the conditional branching, selectors L and M are added to the node set of computations A to K.

In step S14, the node set selected in step S13 is divided into several groups by the node grouping section 43A.

Herein, the selector node, which selects the output from the true block 21 that is executed when the condition of the conditional branching is "true" and the output from the false block 22 that is executed when the condition of the conditional branching is "false", is used as the output node, and a combination of computation nodes is obtained for the computation nodes included in the true block 21 or the false block 22, wherein the computation nodes are connected to the output node and the outputs of the computation nodes have an affect on the output node. Node groups which are the same among the combinations of the nodes are made as another node groups.

For example, in the example shown in FIG. 5, output nodes located at the outputs are not E, G, I, K but L and M. The nodes are is divided into three groups, including a group of A, B, C, a group of D, E, H, I, L and a group of F, G, J, K, M.

In step S15, as in the case of step S4 in FIG. 4, an input unit of a node group is made compact by the graph compacting section 44A, and the number of selectors required when a circuit is shared is reduced.

In step S16, an output unit of the node group is also made compact by the graph compacting section 44A, and the number of selectors required when the circuit is shared is reduced.

Here, when an output node of a node group is a selector and a plurality of nodes connected to an input of the selector are all of the same computation type A, the area occupied by a circuit for executing a sub-graph having the computation of type A connected to an input of each of the selectors, and the area occupied by a circuit for executing another sub-graph having an output of the selector connected to an input of one computation of type A are compared. When the former is larger, the sub-graph is changed such that the output of the selector is connected to the input of the one computation of type A.

For example, as shown in a node group shown in Portion (a) of FIG. 11, when computations 52 and 53 of the same type (computation type C) are connected to an input side of a selector 51, the computation 52 is executed only when the condition of the conditional branching is "true", and the computation 53 is executed only when the condition of the conditional branching is "false". Thus, they are not executed at the same time. Hence, as shown in Portion (b) of FIG. 11, the computation 52 and the computation 53 can be processed using one computation (computation type C) 54.

When Portion (a) of FIG. 11 and Portion (b) of FIG. 11 are compared, the computation type C used in Portion (b) of FIG. 11 is for only the computation 54, the number of which is one less than that in Portion (a) of FIG. 11. Thus, the area occupied by a circuit for executing this sub-graph is smaller than that in Portion (a) of FIG. 11.

Further, a similar processing is repeated on an input of a newly created selector 55. In the case of Portion (b) of FIG. 11, a computation (computation type A) and a computation (computation type B) 56 of different types are connected to the input of the selector 55. Thus, the processing is completed.

However, as shown in Portion (a) of FIG. 12, in the case where computations (computation type A) 62 and 63 having two inputs are connected to an input side of a selector 61, if a similar processing is performed, then the processing can be performed by one computation (computation type A) 64, as shown in Portion (b) of FIG. 12. However, two selectors 65, 66 are required.

As such, when (area of the selector)<(area of the computing unit), Portion (b) of FIG. 12 is preferred. Otherwise, Portion (a) of FIG. 12 is preferred.

Generally, when (area of a computing unit)>(area of a selector) ×((number of inputs of the computing unit)−1), then the size of the area is reduced. Thus, a conversion for compacting a sub-graph, as shown in FIG. 11 and FIG. 12, is conducted.

Next, in step S17 in FIG. 10, as in the case of step S5 in FIG. 4, the processings of S11 to S16 are repeated so as to be performed on all of the conditional branchings.

In step S18, as in the case of step S6 in FIG. 4, the plurality of sub-graphs stored in the database 3 due to the processings of step S11 to S17 are compared by the sub-graph comparison section 45, and the same sub-graphs are detected.

As described above, according to Embodiment 2, it is possible to detect the same sub-graphs including a selector which is located at an output unit of a conditional branching. In addition, it is possible to compact the output unit by utilizing the property of the conditional branching, and it is possible to further enhance the area-size reduction effect when a circuit is shared.

Embodiments 1 and 2 have described the same sub-graph detection apparatus for data flow graph and the same sub-graph detection method for data flow graph using the same sub-graph detection apparatus for data flow graph according to the present invention. However, the same sub-graph detection method for data flow graph according to the present invention can be executed by a CPU (Central Processing Unit; control section) in a computer system by describing a processing procedure (algorithm) for the same sub-graph detection method as a control program and storing it in a computer-readable recording medium (e.g., magnetic disk and optical disk).

Embodiments 1 and 2 are structured so as to include the graph compacting sections 44 and 44A, as shown in FIG. 3. However, the present invention is not limited to this. Even in the case where the graph compacting section 44 or 44A is not included, when targeting on a conditional branching, there are many cases in which similar processings are described in the conditional branching. By searching the vicinity of the conditional branching, it is possible to effectively find the same sub-graphs. As described above, in detecting the same sub-graphs in the data flow graph, it is possible to detect sub-graphs having a large area-size reduction effect at a high speed owing to the execution of the behaviors of the sub-graphs by a shared circuit.

A further description will be given. In a conventional method, the same sub-graphs, which exist at two or more locations in the data flow graph, are detected. Here, when all the sub-graphs in the data flow graph are targeted for the detection, then the time for the processing becomes enormous, which is not practical. The conventional method "Improved Interconnect Sharing by Identity Operation Insertion" (Reference 5) reduces the processing time by targeting only a series of graphs with no branching, as shown in Portion (a) of FIG. 19. However, when a circuit for executing such a graph with no branching is shared at two or more locations, a multiplicity of selectors is required, as shown in Portion (b) of FIG. 19, and thus the area-size reduction effect cannot be obtained. On the other hand, although the present invention performs the detection of the same sub-graphs as well, it reduces the processing time by targeting on a conditional branching in a data flow graph and only searching the vicinity of the conditional branching. Since the present invention includes searching a sub-graph with a branching, it is possible to search a sub-graph including a multiplicity of computations with a small number of inputs, as shown in Portion (a) of FIG. 20 of the present invention. When a circuit for executing such a sub-graph is shared at two or more locations, a small number of selectors is required, as shown in Portion (b) of FIG. 20, and thus the area-size reduction effect due to the sharing of the circuit is large.

As described above, the present invention is exemplified by the use of its preferred Embodiments 1 and 2. However, the present invention should not be interpreted solely based on the present Embodiments 1 and 2. It is understood that the scope of the present invention should be interpreted solely based on the claims. It is also understood that those skilled in the art can implement equivalent scope of technology, based on the description of the present invention and common knowledge from the description of the detailed preferred Embodiments 1 and 2 of the present invention. Furthermore, it is understood that any patent, any patent application and any references cited in the present specification should be incorporated by reference in the present specification in the same manner as the contents are specifically described therein.

INDUSTRIAL APPLICABILITY

In a field of: a same sub-graph detection apparatus for data flow graph for detecting the same sub-graph in a data flow graph in order to reduce a circuit occupied area by sharing a circuit when performing a behavioral synthesis (high-level synthesis), which is used for an automatic design of a large-scale logic circuit (e.g., system LSI and the like) and which performs a computer-automated synthesis of a logic circuit from a behavioral description; a high-level synthesis apparatus using the same sub-graph detection apparatus for data flow graph; a same sub-graph detection method for data flow graph using the same sub-graph detection apparatus; a same sub-graph detection control program for data flow graph for causing a computer to execute each processing procedure of the same sub-graph detection method for data flow graph; and computer-readable recording medium having the control program recorded thereon, it is possible to detect the same sub-graphs in the data flow graph at a high speed, and, by processing the plurality of same sub-graphs using a shared circuit, it is possible to prevent the increase of the area of hardware and the increase of a cost when performing the behavioral synthesis (high-level synthesis), which is used for the automatic design of the large-scale logic circuit (e.g., system LSI and the like) and which performs the computer-automated synthesis of the logic circuit from the behavioral description. In addition, it is possible to obtain sub-graphs to be detected, in which the number of selectors required when sharing a circuit for processing the sub-graphs is small and an area-size reduction effect due to the sharing is large.

The invention claimed is:

1. A same sub-graph detection apparatus for data flow graph, comprising:
a conditional branching selection section configured to select one conditional branching from one or a plurality of conditional branchings in a data flow graph represented by a plurality of nodes indicating computations and branches indicating flows of data input/output to the nodes;
a node set selection section configured to select a node set included in the selected conditional branching;
a node grouping section configured to divide the selected node set into a plurality of groups, each of the plurality of groups being usable as a sub-graph; and
a sub-graph comparison section configured to detect same sub-graphs by comparing a plurality of sub-graphs obtained as a result of each processing performed on the one or the plurality of conditional branchings by the conditional branching selection section, the node set selection section and the node grouping section,
wherein the node grouping section is configured such that for each output node that generates an output of a true block or a false block that is executed when a condition of the conditional branching is "true" or "false", the node grouping section obtains a combination of the nodes for each node included in the true block or the false block, wherein the outputs of the nodes to be obtained have an effect on the output nodes; and divides combinations of the nodes for the output nodes into node groups, which are the same among the combinations of the nodes for the output nodes, and node groups for each output node other than computation nodes.

2. A same sub-graph detection apparatus for data flow graph according to claim 1, further comprising a graph compacting section configured to compact at least some of input units and output units of the groups, which are obtained by the node grouping section, with respect to a circuit-occupied area, and configured to output a compacted sub-graph.

3. The same sub-graph detection apparatus for data flow graph according to claim 2, wherein the node set selection section is configured to select, as the node set, a node included in a true block that is executed when a condition of the conditional branching is "true" and a node included in a false block that is executed when the condition of the conditional branching is "false".

4. The same sub-graph detection apparatus for data flow graph according to claim 3, wherein the node set selection section is configured to add, to the node set, a selector node for selecting an output from the true block that is executed when the condition of the conditional branching is "true" and an output from the false block that is executed when the condition of the conditional branching is "false".

5. The same sub-graph detection apparatus for data flow graph according to claim 2, wherein the graph compacting section is configured to target on each node located at an input unit of a node group obtained by the dividing by the node grouping section and compares a first sum of an area occupied by a circuit for executing the sub-graph and an area occupied by a selector required when the circuit is shared at a plurality of locations to a second sum of an area occupied by a circuit for executing a sub-graph with a targeted node removed from the sub-graph which includes, the targeted node, an area occupied by a selector required when the circuit is shared at a plurality of locations and an area occupied by a computing unit required in order to execute the removed targeted node, wherein the graph compacting section is configured to that when the second sum is smaller than the first sum, the targeted node is removed from the sub-graph and the input unit is compacted.

6. The same sub-graph detection apparatus for data flow graph according to claim 1, wherein the conditional branching selection section is configured to select the conditional branchings in a predetermined or arbitrary order.

7. The same sub-graph detection apparatus for data flow graph according to claim 1, wherein the node set selection section is configured to select, as the node set, a node included in a true block that is executed when a condition of the conditional branching is "true" and a node included in a false block that is executed when the condition of the conditional branching is "false".

8. The same sub-graph detection apparatus for data flow graph according to claim 7, wherein the node set selection section is configured to add, to the node set, a selector node for selecting an output from the true block that is executed when the condition of the conditional branching is "true" and an output from the false block that is executed when the condition of the conditional branching is "false".

9. The same sub-graph detection apparatus for data flow graph according to claim 1, wherein the node set selection section is configured to add, to the node set, a selector node for selecting an output from a true block that is executed when the condition of the conditional branching is "true" and an output from a false block that is executed when the condition of the conditional branching is "false".

10. The same sub-graph detection apparatus for data flow graph according to claim 9, wherein the node grouping section is configured to use the selector node as an output node that generates an output of a true block or a false block that is executed when a condition of the conditional branching is "true" or "false" in order to obtain a combination of the nodes for each node included in the true block or the false block, wherein the outputs of the nodes to be obtained have an effect on the output nodes; and the node grouping section is configured to divide combinations of the nodes for the output nodes into node groups, which are the same among the combinations of the nodes for the output nodes, and node groups for each output node other than computation nodes.

11. The same sub-graph detection apparatus for data flow graph according to claim 10, further comprising a graph compacting section configured so that when each output node of a group obtained by the node grouping section is the selector node and a plurality of nodes connected to an input side of the selector node are all of a same computation type, the graph compacting section compares an area occupied by a circuit for executing a sub-graph having the nodes of the same computation type connected to each input side of the selector node to an area occupied by a circuit for executing a another sub-graph having an output of the selector node connected to the input side of one node of the same computation type, and when the area occupied by the former is larger than the area occupied by the latter, the graph compacting section changes the sub-graph such that the output of the selector node is connected to the input side of the one node of the same computation type.

12. The same sub-graph detection apparatus for data flow graph according to claim 1, further comprising a graph compacting section configured to target on each node located at an input unit of a node group obtained by the node grouping section and compare a first sum of an area occupied by a circuit for executing the sub-graph and an area occupied by a selectors required when the circuit is shared at a plurality of locations to a second sum of an area occupied by a circuit for executing a sub-graph with a targeted node removed from the sub-graph, which includes the targeted node, an area occupied by a selectors required when the circuit is shared at a plurality of locations and an area occupied by a computing unit required in order to execute the removed targeted node, and wherein the graph compacting section is configured so that when the second sum is smaller than the first sum, the targeted node is removed from the sub-graph and the input unit is compacted.

13. The same sub-graph detection apparatus for data flow graph according to claim 1, wherein the sub-graph comparison section is configured to detect the same sub-graphs by creating character strings corresponding to shapes of the respective sub-graphs with a one to one relationship, comparing the character strings and detecting same character strings.

14. The same sub-graph detection apparatus for data flow graph according to claim 13, wherein the sub-graph comparison section is configured to detects the same sub-graphs by comparing hash values obtained by inputting the character strings into a hash function, detecting same hash values and detecting the same character strings.

15. A high-level synthesis apparatus for automatically designing a circuit diagram by performing a scheduling process and an allocation process on a data flow graph generated by using the same sub-graph detection apparatus for data flow graph according to claim 1 and generating a data path and a controller based on a scheduling result and an allocation result.

16. A method of detecting a same sub-graph for data flow graph for a digital circuit behavior using a detection apparatus including a conditional branching selection section, a node set selection section, a node grouping section and a sub-graph comparison section, the method comprising:

selecting one conditional branching from one or a plurality of conditional branchings in a data flow graph represented by a plurality of nodes indicating computations and branches indicating flows of data input/output to the nodes using the conditional branching selection section;

selecting a node set included in the selected conditional branching using the node set selection section;

dividing the selected node set into a plurality of groups using the node grouping section; and using each of the plurality of groups as a sub-graph, detecting same sub-graphs by comparing a plurality of sub-graphs obtained by performing the selecting one conditional branching using the sub-graph comparison section, the selecting a node set included in the selected conditional branching, and the dividing the selected node set included in the selected conditional branching into a plurality of groups, wherein for each output node that generates an output of a true block or a false block that is executed when a condition of the conditional branching is "true" or "false", selecting includes obtaining a combination of the nodes for each node included in the true block or the false block, wherein the outputs of the nodes to be obtained have an effect on the output nodes; and dividing combinations of the nodes for the output nodes into node groups, which are the same among the combinations of the nodes for the output nodes, and node groups for each output node other than computation nodes.

17. The method according to claim 16, further comprising compacting at least some of input units and output units of the groups, which are obtained by the dividing, with respect to a circuit-occupied area and outputting a compacted sub-graph.

18. The method according to claim 17, wherein the compacting includes targeting on each node located at an input unit of a node group obtained by the dividing, and comparing a first sum of an area occupied by a circuit for executing the sub-graph and an area occupied by a selectors required when the circuit is shared at a plurality of locations to a second sum of an area occupied by a circuit for executing a sub-graph with a targeted node removed from the sub-graph, which includes the targeted node, wherein an area occupied by a selector required when the circuit is shared at a plurality of locations and an area occupied by a computing unit required in order to execute the removed targeted node, and when the second sum is smaller than the first sum, the targeted node is removed from the sub-graph and the input unit is compacted.

19. The method according to claim 17, wherein when each output node of a group obtained by the dividing is the selector node and a plurality of nodes connected to an input side of the selector node are all of a same computation type, the detecting includes comparing an area occupied by a circuit for executing a sub-graph having the nodes of the same computation type connected to the input side of the selector node to an area occupied by a circuit for executing a another sub-graph having an output of the selector node connected to the input side of one node of the same computation type, and when the area occupied by the former is larger than the area occupied by the latter, the detecting includes changing the sub-graph such that the output of the selector node is connected to the input side of the one node of the same computation type.

20. The method according to claim 17, wherein the selecting includes selecting, as the node set, a node included in a true block that is executed when a condition of the conditional branching is "true" and a node included in a false block that is executed when the condition of the conditional branching is "false".

21. The method according to claim 20, wherein the selecting includes adding, to the node set, a selector node for selecting an output from the true block that is executed when the condition of the conditional branching is "true" and an output from the false block that is executed when the condition of the conditional branching is "false".

22. The method according to claim 21, wherein using the selector node as an output node that generates an output of a true block or a false block that is executed when a condition of the conditional branching is "true" or "false", the dividing obtains a combination of the nodes for each node included in the true block or the false block, wherein the outputs of the nodes to be obtained have an effect on the output nodes; and divides combinations of the nodes for the output nodes into node groups, which are the same among the combinations of the nodes for the output nodes, and node groups for each output node other than computation nodes.

23. The method according to claim 22, wherein when an output node of a group obtained by the dividing is the selector node and a plurality of nodes connected to an input side of the selector node are all of a same computation type, the detecting includes comparing an area occupied by a circuit for executing a sub-graph having the nodes of the same computation type connected to the input side of the selector node to an area occupied by a circuit for executing another sub-graph having an output of the selector node connected to the input side of one node of the same computation type, and when the area occupied by the former is larger than the area occupied by the latter, the detecting includes changing the sub-graph such that the output of the selector node is connected to the input side of the one node of the same computation type.

24. The method according to claim 17, wherein the compacting, includes
targeting on each node located at an input unit of the node group obtained by the dividing and comparing a sum of an area occupied by a circuit for executing the sub-graph and an area occupied by a selector required when the circuit is shared at a plurality of locations to a sum of an area occupied by a circuit for executing a sub-graph with a targeted node removed from the sub-graph, which includes the targeted node, an area occupied by a selector required when the circuit is shared at a plurality of locations and an area occupied by a computing unit required in order to execute the removed targeted node, and when the sum of the latter is smaller than the sum of the former, the targeted node is removed from the sub-graph and the input unit is compacted.

25. The method according to claim 16, wherein the selecting of one conditional branching includes selecting the conditional branchings in a predetermined or arbitrary order.

26. The method according to claim 16, wherein the selecting of a node set includes selecting, as the node set, a node included in a true block that is executed when a condition of the conditional branching is "true" and a node included in a false block that is executed when the condition of the conditional branching is "false".

27. The method according to claim 26, wherein the selecting includes adding, to the node set, a selector node for selecting an output from the true block that is executed when the condition of the conditional branching is "true" and an output from the false block that is executed when the condition of the conditional branching is "false".

28. The method according to claim 27, wherein using the selector node as an output node that generates an output of a true block or a false block that is executed when a condition of the conditional branching is "true" or "false", the dividing obtains a combination of the nodes for each node included in the true block or the false block, wherein the outputs of the nodes to be obtained have an effect on the output nodes; and divides combinations of the nodes for the output nodes into node groups, which are the same among the combinations of the nodes for the output nodes, and node groups for each output node other than computation nodes.

29. The method according to claim 28, wherein when an output node of a group obtained by the dividing is the selector node and a plurality of nodes connected to an input side of the selector node are all of a same computation type, the detecting includes comparing an area occupied by a circuit for executing a sub-graph having the nodes of the same computation type connected to the input side of the selector node to an area occupied by a circuit for executing another sub-graph having an output of the selector node connected to the input side of one node of the same computation type, and when the area occupied by the former is larger than the area occupied by the latter, the detecting includes changing the sub-graph such that the output of the selector node is connected to the input side of the one node of the same computation type.

30. The method according to claim 16, wherein the selecting of a node set includes adding, to the node set, a selector node for selecting an output from a true block that is executed when a condition of the conditional branching is "true" and an output from a false block that is executed when the condition of the conditional branching is "false".

31. The method according to claim 30, wherein the selector node is used as an output node that generates an output of a true block or a false block that is executed when a condition of the conditional branching is "true" or "false", the selecting includes obtaining a combination of the nodes for each node included in the true block or the false block, wherein the outputs of the nodes to be obtained have an effect on the output nodes; and divides combinations of the nodes for the output nodes into node groups, which are the same among the combinations of the nodes for the output nodes, and node groups for each output node other than computation nodes.

32. The method according to claim 16, wherein the detecting includes detecting the same sub-graphs by creating character strings corresponding to shapes of the respective sub-graphs with a one to one relationship, comparing the character strings and detecting same character strings.

33. The method according to claim 32, wherein the detecting includes detecting the same sub-graphs by comparing hash values obtained by inputting the character strings into a hash function, detecting same hash values and detecting the same character strings.

34. A same sub-graph detection control program for data flow graph having each method step described thereon for causing a computer to execute the same sub-graph detection method for data flow graph according to claim 16.

35. A computer-readable recording medium having the same sub-graph detection control program for data flow graph according to claim 34 recorded thereon.

* * * * *